(12) United States Patent
Wang et al.

(10) Patent No.: US 11,264,470 B2
(45) Date of Patent: Mar. 1, 2022

(54) LATERAL BIPOLAR JUNCTION TRANSISTOR DEVICE AND METHOD OF MAKING SUCH A DEVICE

(71) Applicant: GLOBALFOUNDRIES U.S. Inc., Santa Clara, CA (US)

(72) Inventors: Haiting Wang, Clifton Park, NY (US); Tamilmani Ethirajan, Guilderland, NY (US); Zhenyu Hu, Clifton Park, NY (US); Tung-Hsing Lee, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/803,711

(22) Filed: Feb. 27, 2020

(65) Prior Publication Data

US 2021/0273061 A1 Sep. 2, 2021

(51) Int. Cl.
*H01L 29/417* (2006.01)
*H01L 29/08* (2006.01)
*H01L 29/73* (2006.01)
*H01L 29/10* (2006.01)
*H01L 29/423* (2006.01)

(52) U.S. Cl.
CPC .... *H01L 29/41708* (2013.01); *H01L 29/0808* (2013.01); *H01L 29/0821* (2013.01); *H01L 29/1008* (2013.01); *H01L 29/42304* (2013.01); *H01L 29/73* (2013.01)

(58) Field of Classification Search
CPC ......... H01L 29/41708; H01L 29/42304; H01L 29/6681; H01L 29/66234; H01L 29/73; H01L 29/785
See application file for complete search history.

(56) References Cited

U.S. PATENT DOCUMENTS

| | | | |
|---|---|---|---|
| 4,873,200 A * | 10/1989 | Kawakatsu | ....... H01L 21/28525 438/367 |
| 7,897,995 B2 | 3/2011 | Yang et al. | |
| 8,310,027 B2 | 11/2012 | Russ et al. | |
| 9,263,583 B2 | 2/2016 | Cai et al. | |
| 9,786,656 B1 | 10/2017 | Anderson et al. | |
| 2006/0060941 A1 | 3/2006 | Sun et al. | |
| 2012/0049282 A1 * | 3/2012 | Chen | ................... H01L 29/7317 257/347 |
| 2015/0102348 A1 * | 4/2015 | Cai | ..................... H01L 29/6625 257/69 |
| 2015/0287650 A1 * | 10/2015 | Chang | ............... H01L 27/10826 438/236 |
| 2017/0141220 A1 * | 5/2017 | Ching | ................... H01L 29/785 |
| 2018/0068998 A1 * | 3/2018 | Wang | ................... H01L 29/735 |
| 2018/0277666 A1 * | 9/2018 | Chu | ...................... H01L 29/739 |
| 2020/0152619 A1 * | 5/2020 | Anderson | .......... H01L 27/0274 |
| 2020/0312994 A1 * | 10/2020 | You | ................... H01L 29/66795 |
| 2021/0066499 A1 * | 3/2021 | Holland | ............. H01L 29/0847 |
| 2021/0083052 A1 * | 3/2021 | Tai | ..................... H01L 29/7853 |

* cited by examiner

*Primary Examiner* — Wasiul Haider
(74) *Attorney, Agent, or Firm* — Francois Pagette; Hoffman Warnick LLC

(57) ABSTRACT

One illustrative device disclosed herein includes a semiconductor substrate and a bipolar junction transistor (BJT) device that comprises a collector region, a base region and an emitter region. In this example, the device also includes a field effect transistor and at least one base conductive contact structure that conductively and physically contacts the base region.

16 Claims, 33 Drawing Sheets

LATERAL BIPOLAR JUNCTION TRANSISTOR DEVICE AND METHOD OF MAKING SUCH A DEVICE

BACKGROUND

Field of the Disclosure

Generally, the present disclosure relates to various novel embodiments of a lateral bipolar junction transistor (BJT) device and various novel methods of making such a lateral BJT device.

Description of the Related Art

Bipolar junction transistor (BJT) devices are widely used in many integrated circuit products. In general, a BJT device comprises a collector, a base and an emitter. Current flows from the collector to the base and exits the BJT device via the emitter. The BJT device may be either an NPN device or a PNP device. Device designers are under constant pressure to increase the operating speed and electrical performance of BJT devices and integrated circuit products that employ such BJT devices.

A system-on-a-chip (SoC) is an integrated circuit product that includes all of the components needed for a system, e.g., a computer. Such an SOC chip may include one or more central processors and co-processors, graphics drivers, memory, power management circuits, wireless communication interfaces and other parts of a fully functional system. Further, because the signals among the various components on the SoC are kept on-die, power requirements of the system on the SoC can be reduced. SoC devices may be formed using BiCMOS technology, which involves the formation of both BJT devices and CMOS transistors (N-type and P-type) on a single chip. Techniques are needed to effectively and efficiently form BJT devices and CMOS transistors in BiCMOS technology applications.

The present disclosure is directed to various novel embodiments of a lateral bipolar junction transistor (BJT) device and various novel methods of making such a lateral BJT device.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various novel embodiments of a lateral bipolar junction transistor (BJT) device and various novel methods of making such a lateral BJT device. One illustrative device disclosed herein includes a semiconductor substrate and a bipolar junction transistor (BJT) device that includes a collector region, a base region and an emitter region. In this example, the device also includes a field effect transistor and at least one base conductive contact structure that conductively and physically contacts the base region.

Another illustrative device disclosed herein includes a semiconductor substrate, a bipolar junction transistor (BJT) device that includes a collector region, a base region and an emitter region, and a field effect transistor. In this example the device also includes at least one conductive contact structure that conductively contacts one of the collector region, the base region and the emitter region and a conductive source/drain metallization structure that conductively contacts a source/drain region of the transistors, wherein a material of construction of the at least one conductive contact structure and a material of construction of the conductive source/drain metallization structure are the same.

BRIEF DESCRIPTION OF THE DRAWINGS

The disclosure may be understood by reference to the following description taken in conjunction with the accompanying drawings, in which like reference numerals identify like elements, and in which.

Figure 1:
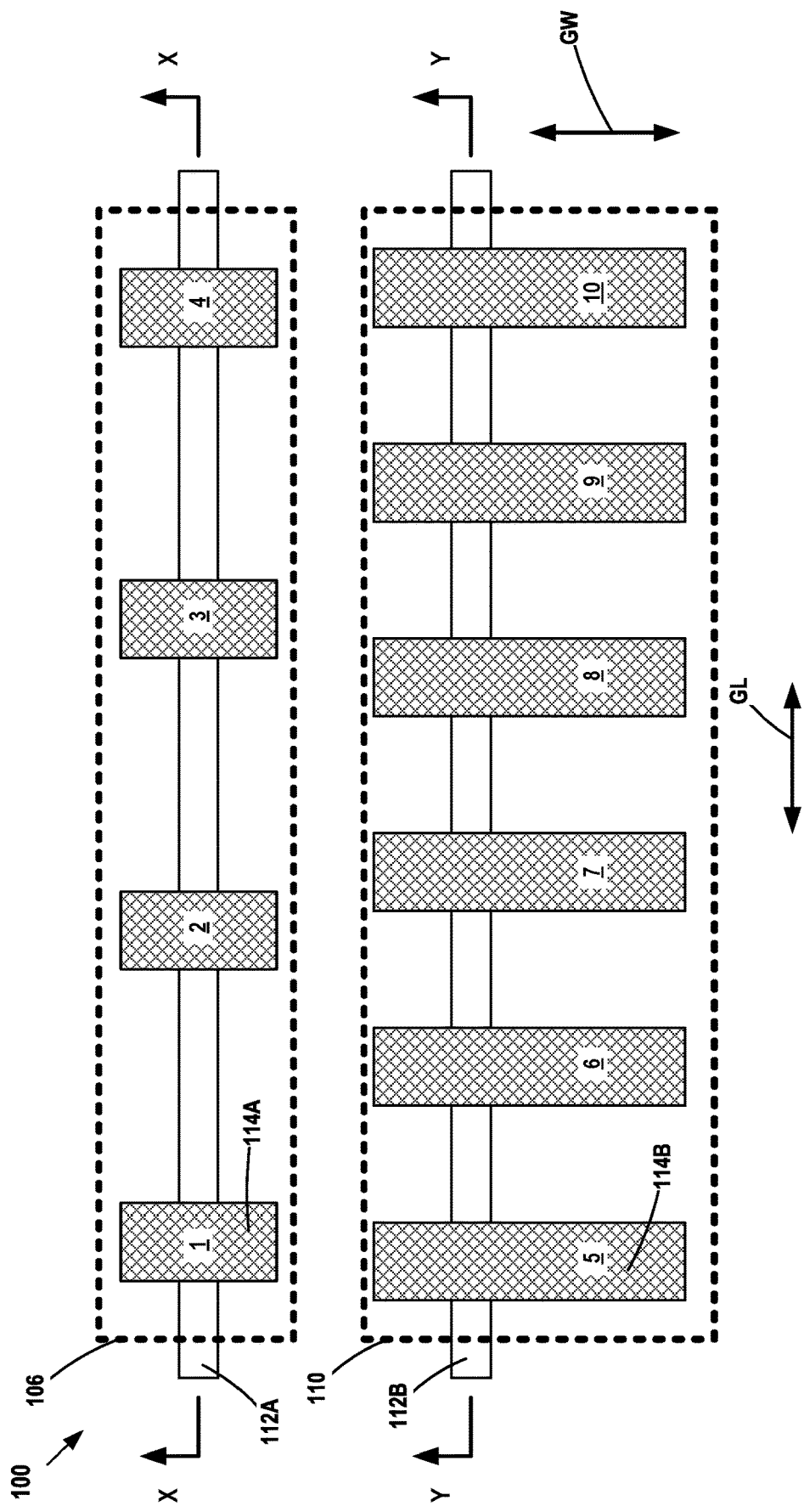
FIGS. 1-33 depict various novel embodiments of a lateral bipolar junction transistor (BJT) device and various novel methods of making such a lateral BJT device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-33 depict an integrated circuit (IC) product 100 that comprises one or more lateral BJT devices 104 formed in a BJT region 106 of a substrate 102 and CMOS-based integrated circuits that comprise both NFET and PFET FinFET transistors 108, i.e., CMOS technology formed in a CMOS circuits region 110 of the substrate 102. Additionally, the lateral BJT device 104 may be either an NPN device or a PNP device and the CMOS transistors 108 may be either an NFET or a PFET device. In the examples depicted herein, the BJT device 104 will be a PNP device and the transistors 108 will be PFET devices. Moreover, in the examples depicted herein, the lateral BJT device 104 will be formed in a fin structure while the transistors 108 will be FinFET devices. However, the presently disclosed subject matter should not be considered to be limited to such fin-based structures as the lateral BJT device 104 and/or the transistors 108 may be formed using devices having other basic configurations such as, for example, a planar configuration.

FIG. 1 is a simplistic plan view of one illustrative embodiment of an IC product 100 disclosed herein. As noted above, the substrate 102 comprises a BJT region 106 where a plurality of lateral BJT devices 104 will be formed and a CMOS circuits region 110 where a plurality of transistors 108 will be formed. The lateral BJT device 104 will be formed above a first fin structure 112A while the transistors 108 will be formed above a second fin 112B. The gate length-current transport (GL) direction and the gate width (GW) direction of the transistors 108 are also depicted in FIG. 1. Also depicted in FIG. 1 are illustrative sacrificial contact structures 114A for the lateral BJT device 104 (numbered 1-4 for ease of reference and sacrificial gate structures 114B for the transistors 108 (numbered 5-10 for ease of reference).

Although the lateral BJT device 104 is depicted as being formed above a single fin 112A, the lateral BJT device 104 can be formed in any desired number of fins. Similarly, although the transistors 108 are depicted as comprising a single fin 112B, the transistors 108 may comprise any number of fins. The fins 112A, 112B will be collectively referenced using the numeral 112.

As will be described more fully below, the sacrificial contact structures 114A and the sacrificial gate structures 114B will be formed at the same time and they will comprise the same material or materials of construction. However, the sacrificial contact structures 114A and the sacrificial gate structures 114B may be formed with a different pitch between adjacent structures and different dimensions in both the vertical and horizontal directions of FIG. 1. In the example depicted herein, the sacrificial contact structures 114A of the lateral BJT device 104 have a greater dimension in the horizontal (GL) direction than do the sacrificial gate structures 114B of the transistors 108, and the sacrificial contact structures 114A are formed with a greater pitch (in the horizontal direction) than are the sacrificial gate structures 114B, but that may not be the case in all applications.

FIGS. 2-33 are cross-sectional views of the lateral BJT device 104 and the transistors 108. More specifically, the even-numbered drawings depict a cross-sectional view (X-X) of the lateral BJT device 104 taken through the fin 112A, while the odd-numbered drawings depict a cross-sectional view (Y-Y) that is taken through the long axis of the fin 112B.

Figure 2:
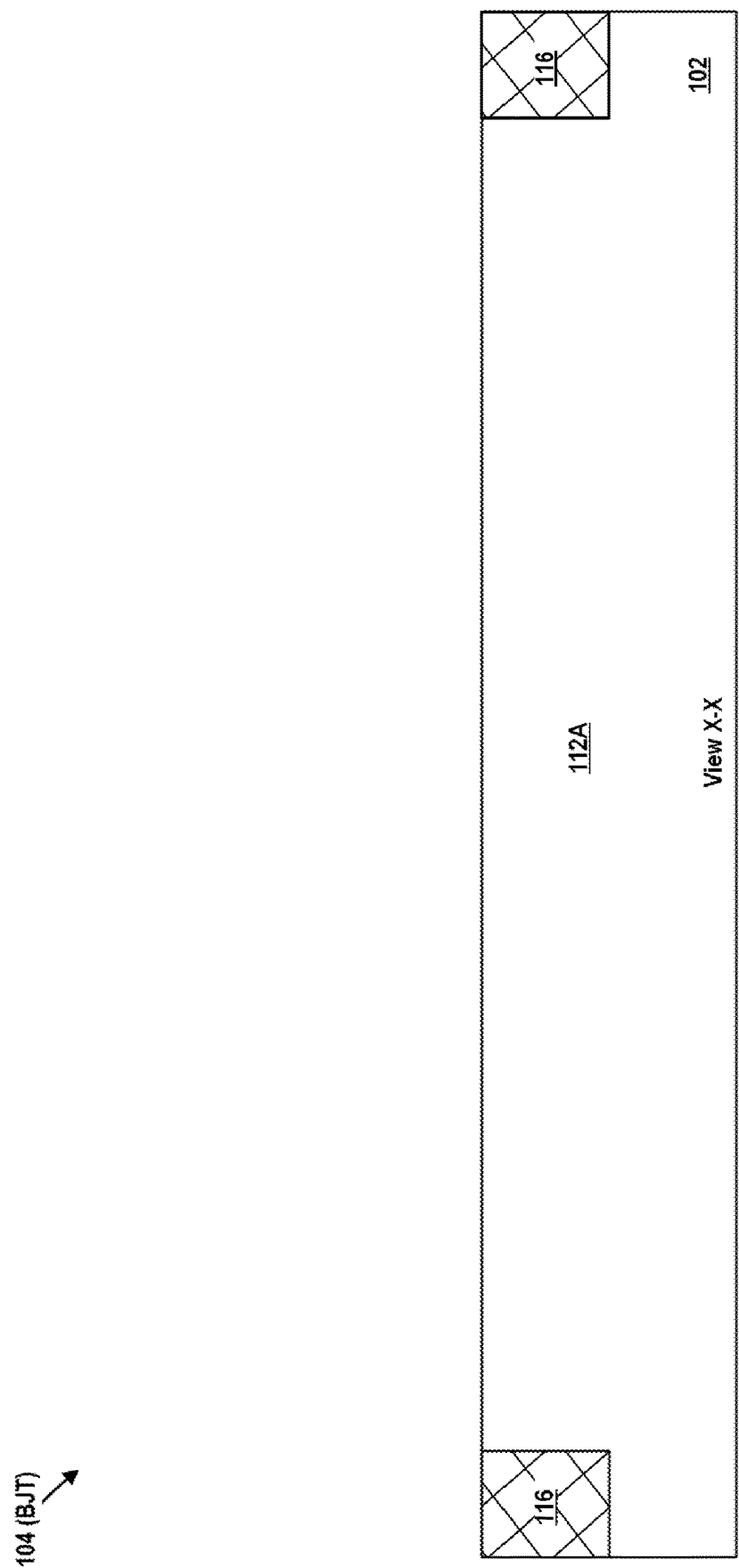
Figure 3:
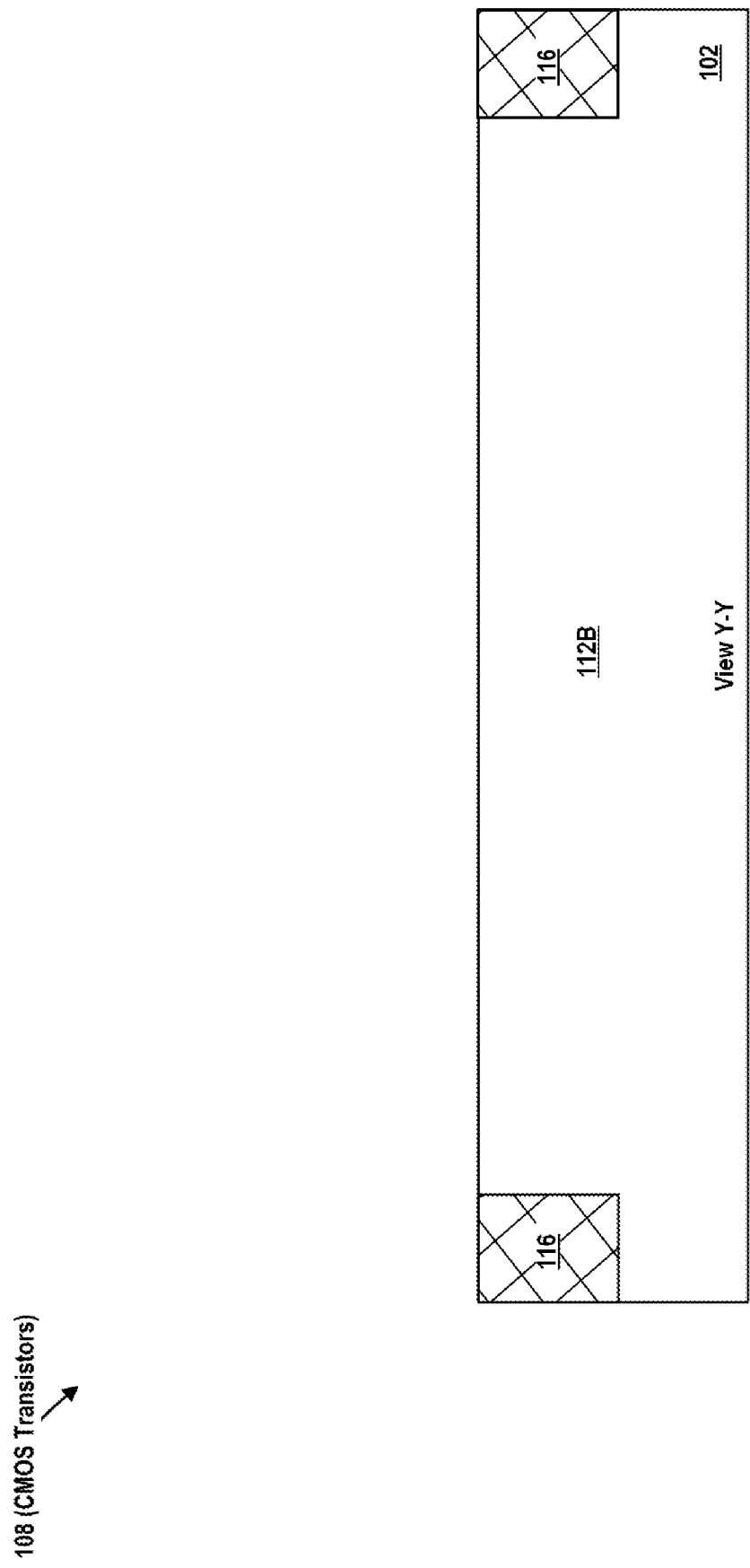

In the depicted examples, and with reference to FIGS. 2 and 3, the lateral BJT devices 104 and the transistors 108 of the IC product 100 will be formed above a semiconductor substrate 102. The substrate 102 may have a variety of configurations, such as a bulk semiconductor substrate depicted herein, or it may take the form of a semiconductor-on-insulator (SOI) substrate. Such an SOI substrate includes a base semiconductor layer, a buried insulation layer positioned on the base semiconductor layer and an active semiconductor layer positioned above the buried insulation layer. In some applications, the substrate 102 may be made of silicon or it may be made of semiconductor materials other than silicon. Thus, the terms "substrate" or "semiconductor substrate" should be understood to cover all semiconductor materials and all forms of such materials. Moreover, in some cases, the substrate 102 may comprise an N-type or P-type dopant material. In the example depicted herein, the substrate 102 will be assumed to be doped with a P-type dopant.

FIGS. 2 and 3 depict the IC product 100 after several process operations were performed. First, the fins 112 were formed by performing known manufacturing process operations. For example, the fins 112 may be formed by performing one or more etching processes, e.g., anisotropic etching processes, through a patterned fin-formation etch mask (not shown) to form a plurality of fin-formation trenches in the substrate 102 and thereby define a plurality of fins 112. The width and height of the fins 112 may vary depending upon the particular application. Additionally, the overall size, shape and configuration of the fin-formation trenches and fins 112 may vary depending on the particular application. The fins 112A and 112B need not have the same axial length (in the gate length direction) and lateral width (in the gate width direction) but that may be the case in some applications. Next, a recessed layer of insulating material (not shown) e.g., silicon dioxide, with a recessed upper surface was formed between the fins 112 by performing traditional manufacturing techniques. Thereafter, an isolation structure 116 was formed in the fins 112 by performing known manufacturing techniques. The isolation structure 116 may be comprised of any insulating material, e.g., silicon dioxide.

Figure 4:
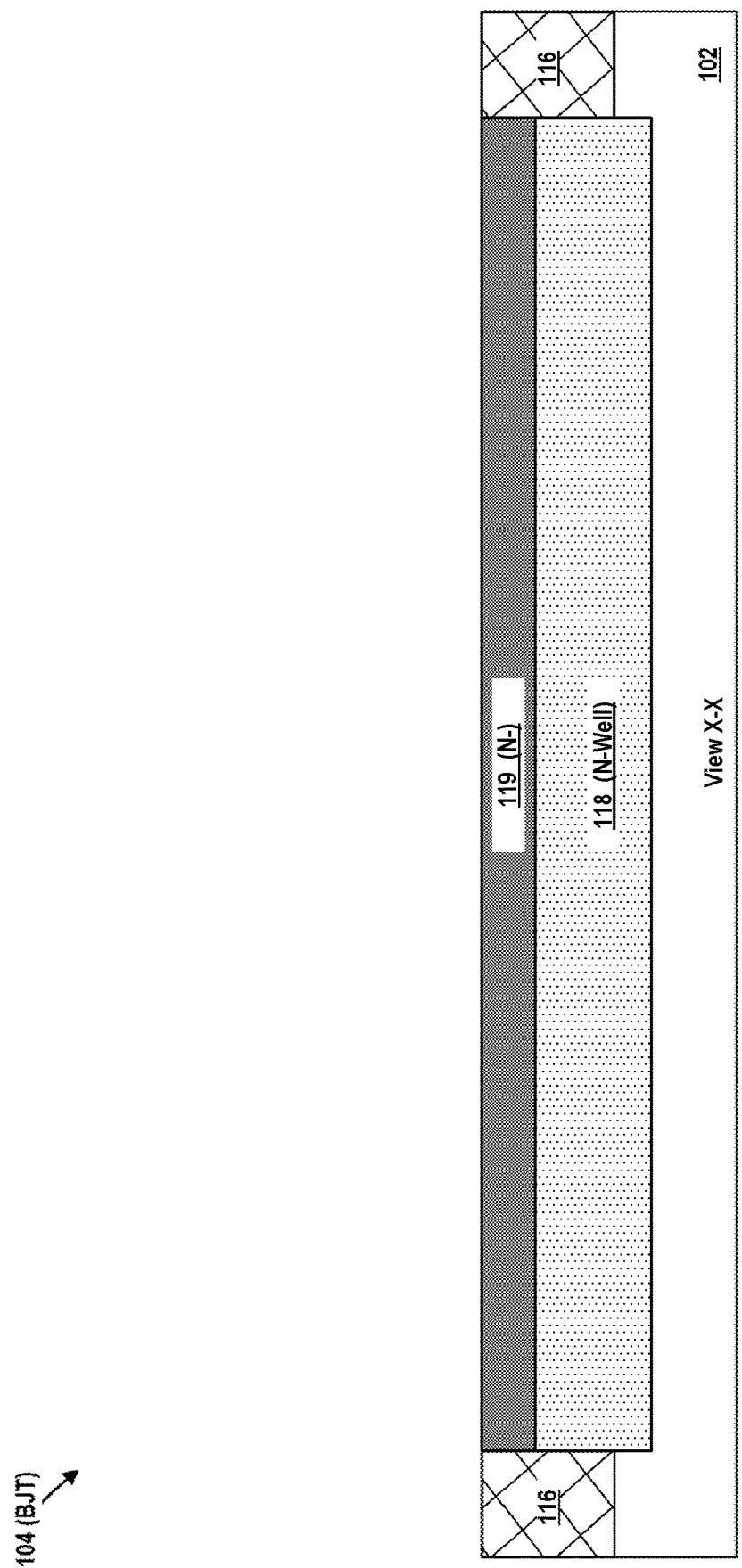
Figure 5:
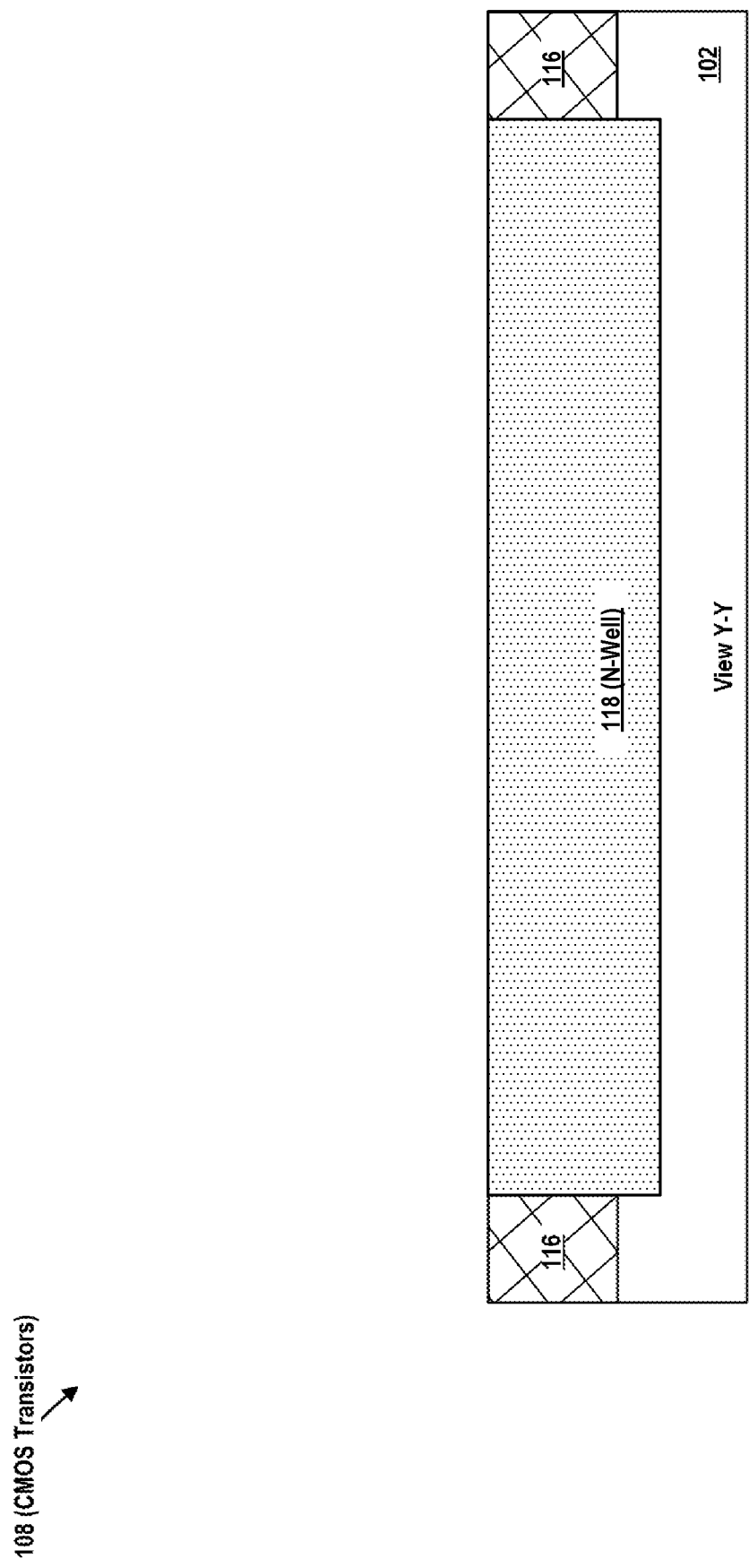

FIGS. 4 and 5 depict the IC product 100 after several process operations were performed. First, an ion implantation process was performed to form a N-well region 118 in both the BJT region 106 and the CMOS circuits region 110. The dopant concentration of N-type dopant material in the N-well region 118 may vary depending upon the particular application, e.g., 1e18-1e19 atoms/cm$^3$. The N-well region 118 may be doped with any species of N-type dopant material. Thereafter, a patterned implant mask (not shown) was formed above the IC product 100. The patterned implant mask may be comprised of a variety of different materials, e.g., a patterned layer of photoresist, and it may be manufactured using known manufacturing techniques. The patterned implant mask covers the CMOS circuits region 110 but exposes the BJT region 106 for further processing. Next, another ion implantation process was performed through the patterned implant mask to form an N-implant region 119 within the N-well region 118 in only the BJT region 106. The dopant concentration of N-type dopant material in the N-implant region 119 may vary depending upon the particular application, e.g., 1e17-1e18 atoms/cm$^3$. Typically, the concentration of N-type dopant material in the N-implant region 119 can be less than the concentration of N-type dopant material in the N-well region 118. The N-implant region 119 may be doped with any species of N-type dopant material. The N-implant region 119 and the N-well region 118 need not be doped with the same species of N-type dopant material, but that may be the case in some applications. As will be appreciated by those skilled in the art after a complete reading of the present application, the N-implant region 119 will be the base region of the lateral BJT device 104.

Figure 6:
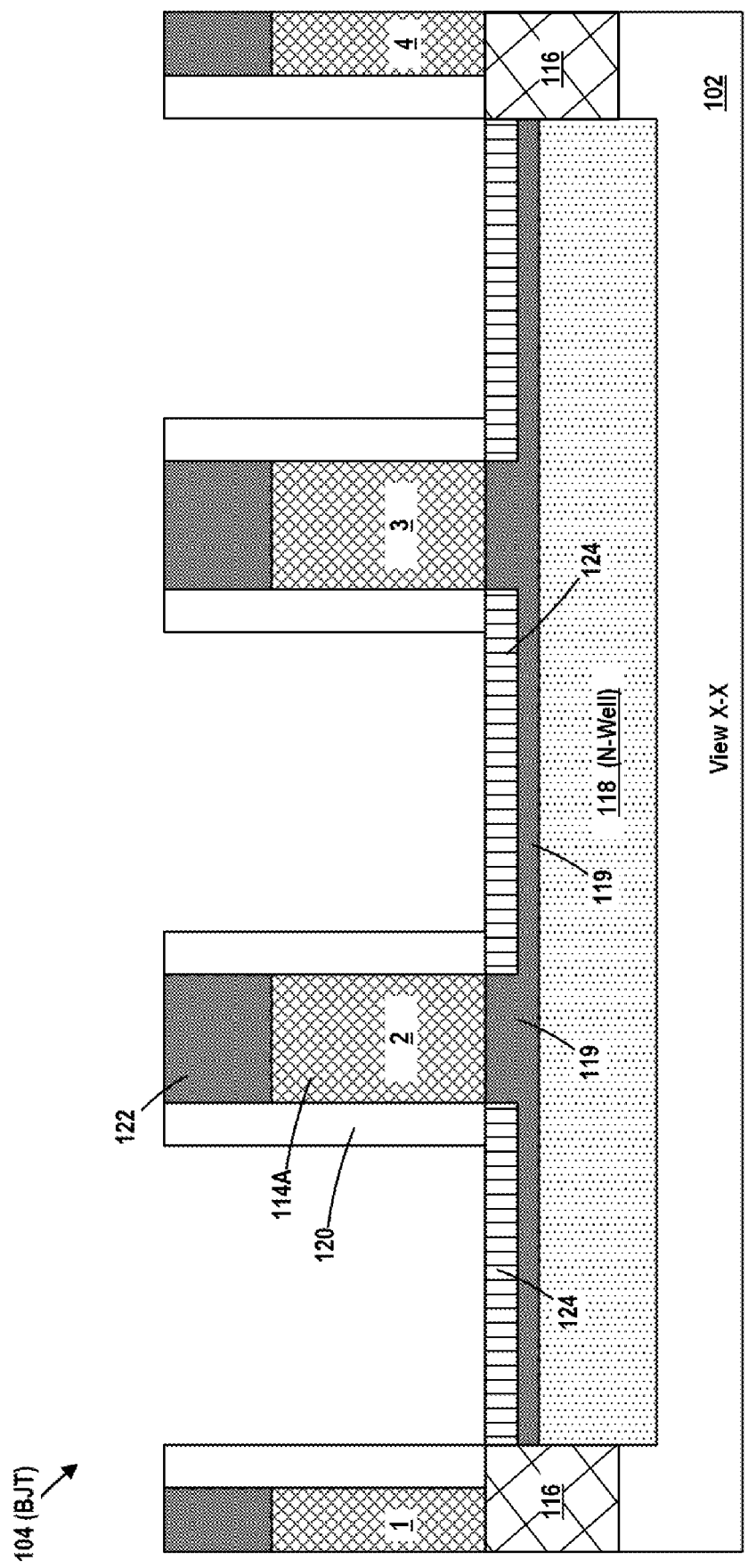
Figure 7:
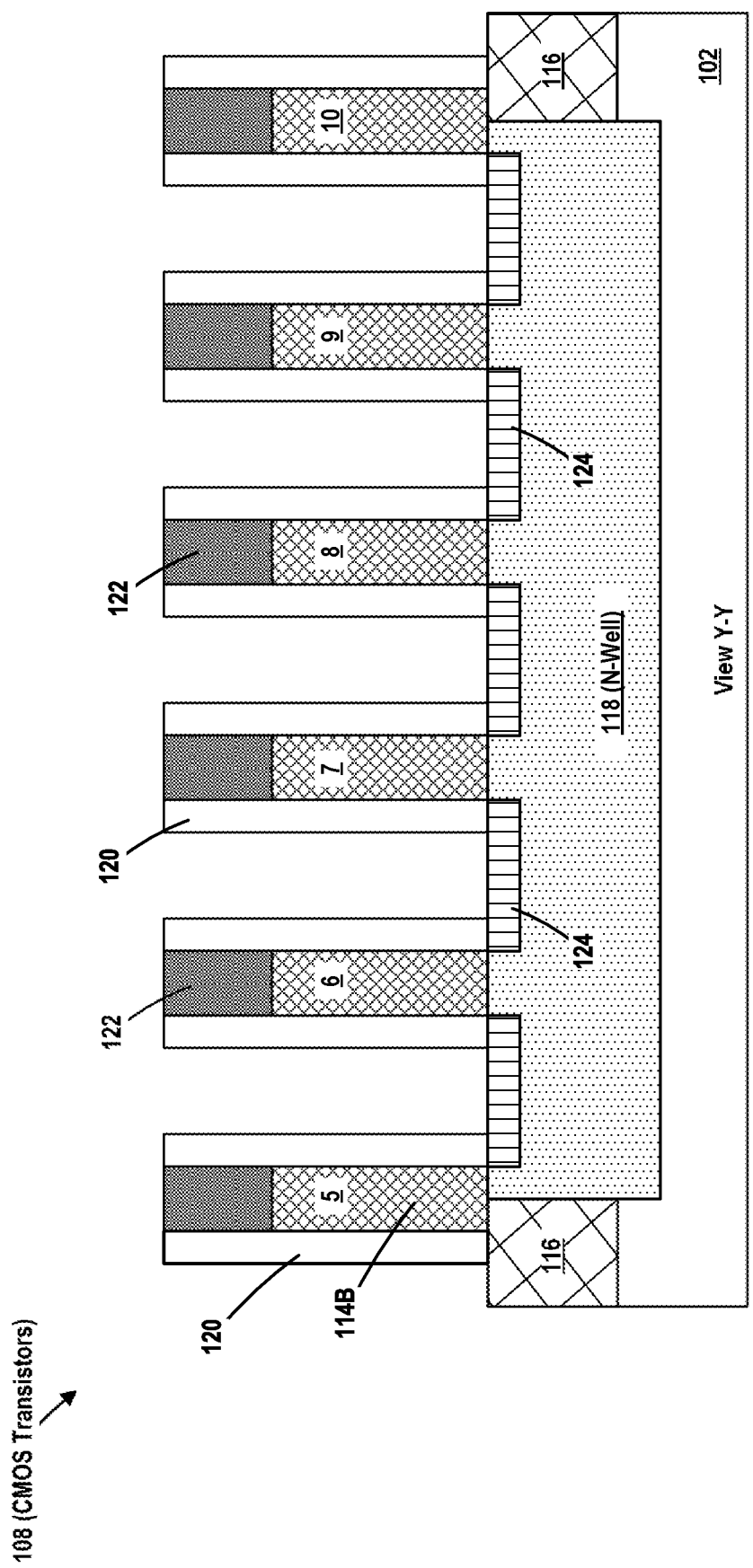

FIGS. 6 and 7 depict the IC product 100 after several process operations were performed. First, the above-referenced patterned implant mask was removed. Next, the materials for the sacrificial contact structures 114A and the sacrificial gate structures 114B of the transistors 108 were formed above the substrate 102. Also depicted in FIGS. 6 and 7 are cap layers 122 and sidewall spacers 120. Various process flows may be performed to form these structures. In one illustrative process flow, the material for the sacrificial contact structures 114A and the sacrificial gate structures 114B as well as the material for the cap layers 122 may be blanket deposited above the substrate. Thereafter, one or more masking and etching processes may be performed on these deposited materials so as to form the sacrificial contact structures 114A and the sacrificial gate structures 114B with cap layers 122 positioned thereabove. At some point in the process flow, the sacrificial contact structures 114A and the sacrificial gate structures 114B may be cut to their desired axial length (in the gate width direction). Next, a sacrificial spacer (not shown) may be formed adjacent the substantially vertically oriented sidewalls of the sacrificial contact structures 114A and the sacrificial gate structures 114B. The sacrificial sidewall spacer may be relatively thin (at its base), it may be comprised of a material such as, for example, silicon dioxide, and it may be formed by performing known manufacturing techniques.

Still referencing FIGS. 6 and 7, after formation of the sacrificial sidewall spacers, an LDD ion implantation process was performed to form P-type LDD implant regions 124 within the N-well region 118 in both the BJT region 106 and the CMOS circuits region 110. The dopant concentration of P-type dopant material in the P-type LDD implant regions 124 may vary depending upon the particular application, e.g., about 1e15 atoms/cm$^3$. The P-type LDD implant regions 124 may be doped with any species of P-type dopant material. Note that the P-type LDD implant regions 124 are physically larger (in the direction corresponding to the gate length direction of the transistors 108) on the lateral BJT device 104 as compared to the P-type LDD implant regions 124 on the transistors 108 due to the larger pitch between the sacrificial contact structures 114A as compared to the pitch between the sacrificial gate structures 114B. After formation of the P-type LDD implant regions 124, the sacrificial sidewall spacers were removed and the sidewall spacers 120 were formed around the sacrificial contact structures 114A and the sacrificial gate structures 114B. In one example, the sidewall spacers 120 may be formed by performing a conformal deposition process to form a conformal layer of sidewall spacer material on the sacrificial contact structures 114A and the sacrificial gate structures 114B. At that point, an anisotropic etching process may be performed to remove horizontally oriented portions of the layer of spacer material, thereby forming the sidewall spacers 120 that are positioned on or adjacent the substantially vertically oriented sidewalls of the sacrificial contact structures 114A and the sacrificial gate structures 114B. Although only a single spacer 120 is shown in the attached drawings, those skilled in the art will appreciate that multiple sidewall spacers may be formed adjacent the sacrificial contact structures 114A and the sacrificial gate structures 114B. In terms of materials, the sacrificial gate structures 114B typically comprise a sacrificial gate insulation layer (not separately shown), such as silicon dioxide, that is formed on the fin 112B and a sacrificial gate electrode (not separately shown) made of, for example, polysilicon or amorphous silicon, that is formed on the sacrificial gate insulation layer. The sacrificial contact structures 114A will have the same material or materials of construction as the sacrificial gate structures 114B. The cap layers 122 may be comprised of a material such as silicon nitride, and the sidewall spacer 120 may be comprised of a low-k insulating material (k value less than about 3.4).

Figure 8:
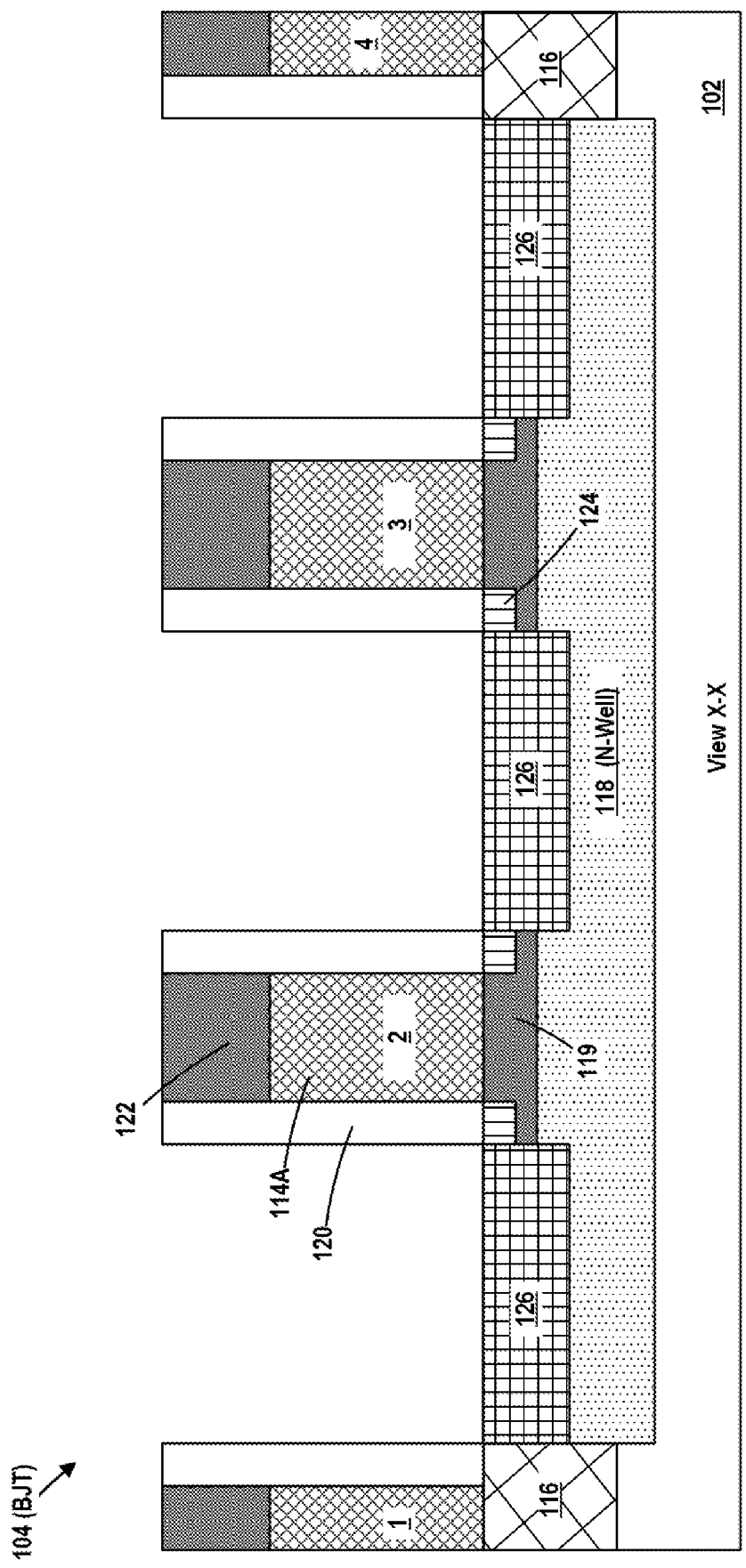
Figure 9:
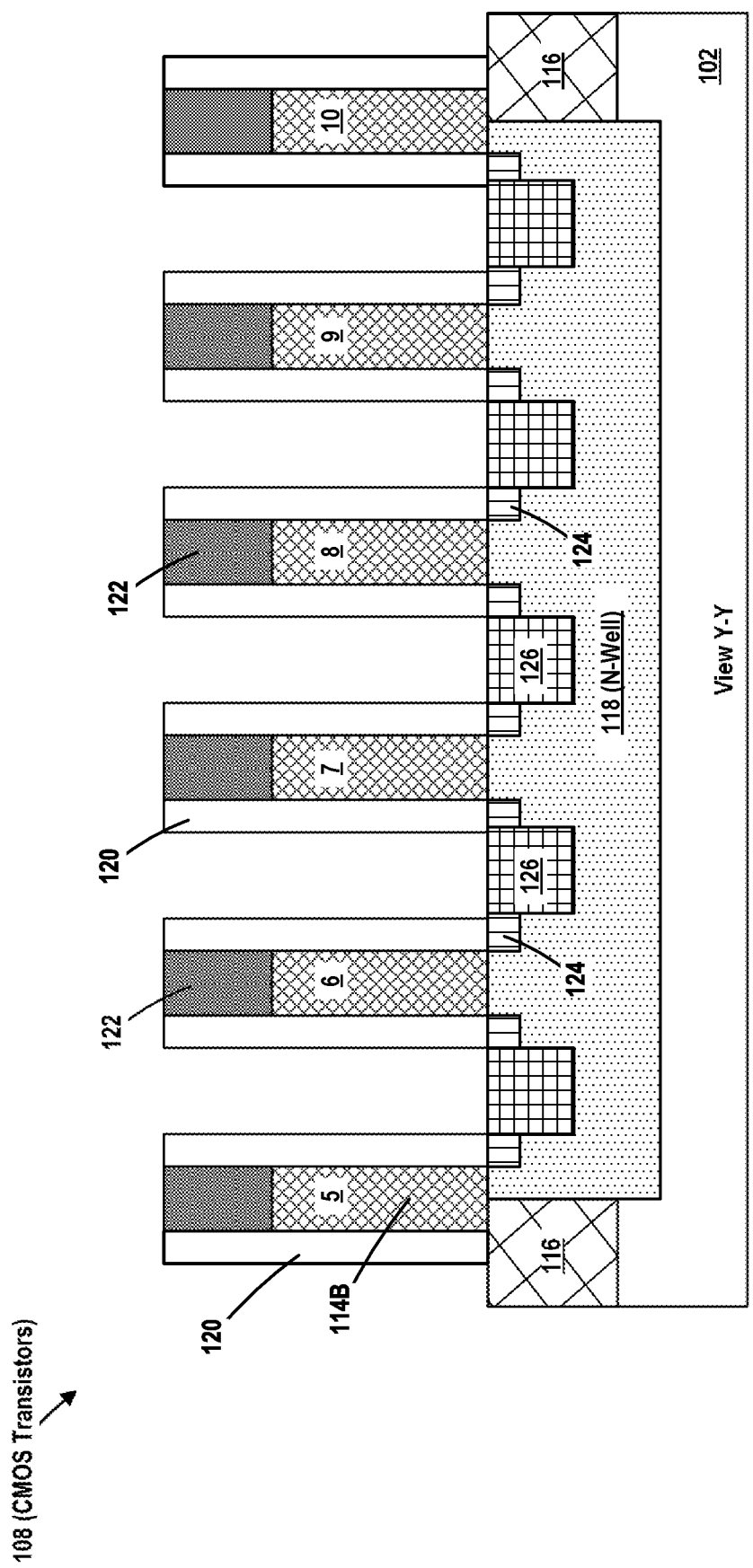

FIGS. 8 and 9 depict the IC product 100 after regions of P-doped epi semiconductor material 126 were formed in the substrate 102 on both the lateral BJT device 104 and the transistors 108. In one illustrative process flow, the regions of P-doped epi semiconductor material 126 may be formed by initially etching a plurality of epi cavities (of any desired depth) into the fins 112 and thereafter performing an epitaxial growth process. The regions of P-doped epi semiconductor material 126 may have a dopant concentration of about 1e20 atoms/cm$^3$, and they may be doped in situ or by ion implantation with any species of P-type dopant material. The regions of P-doped epi semiconductor material 126 may be made of any desired semiconductor material, e.g. silicon germanium, silicon carbon, etc. In some applications, the regions of P-doped epi semiconductor material 126 may be omitted and a P-doped implant region may be formed in place of the regions of P-doped epi semiconductor material 126 by performing an ion implantation process.

Figure 10:
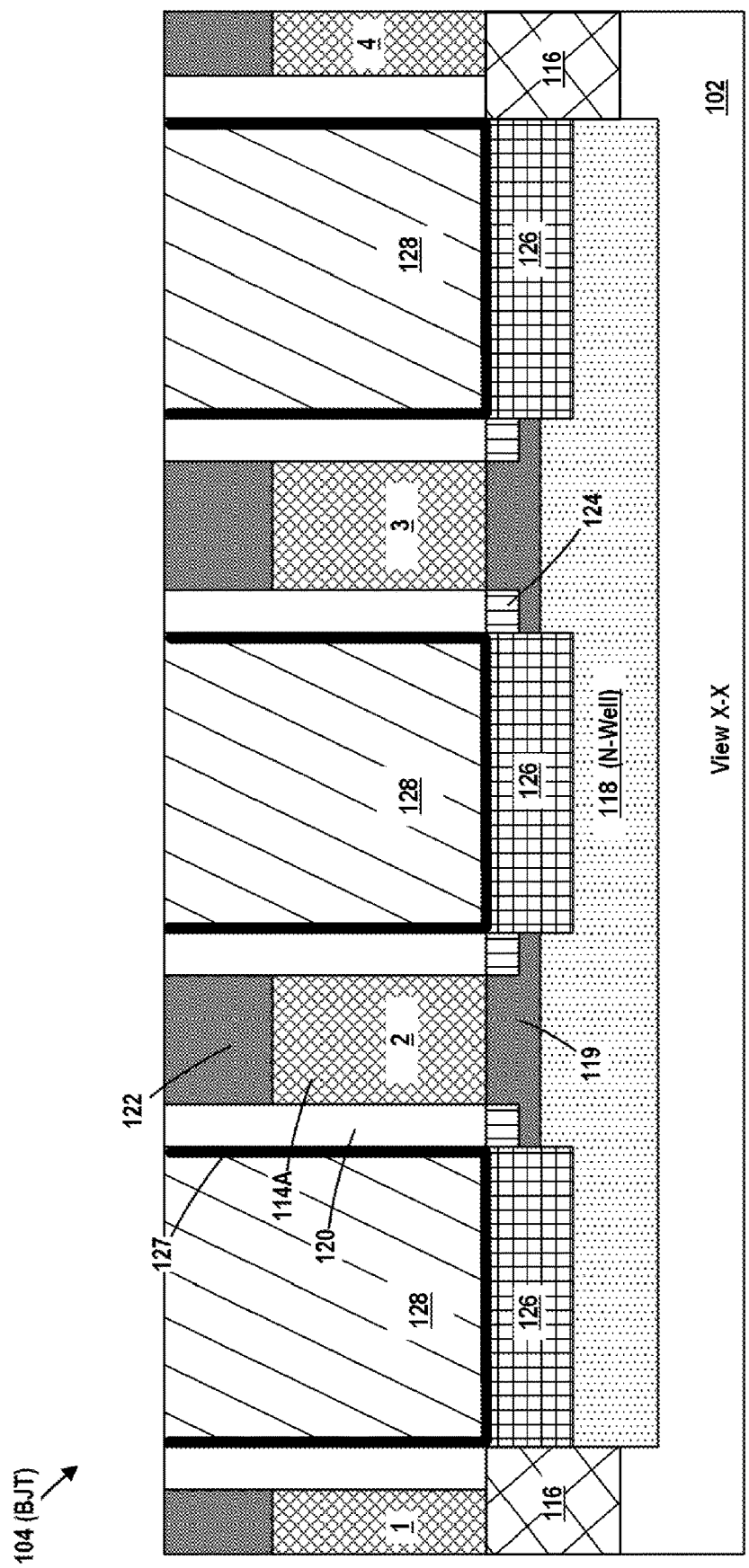
Figure 11:
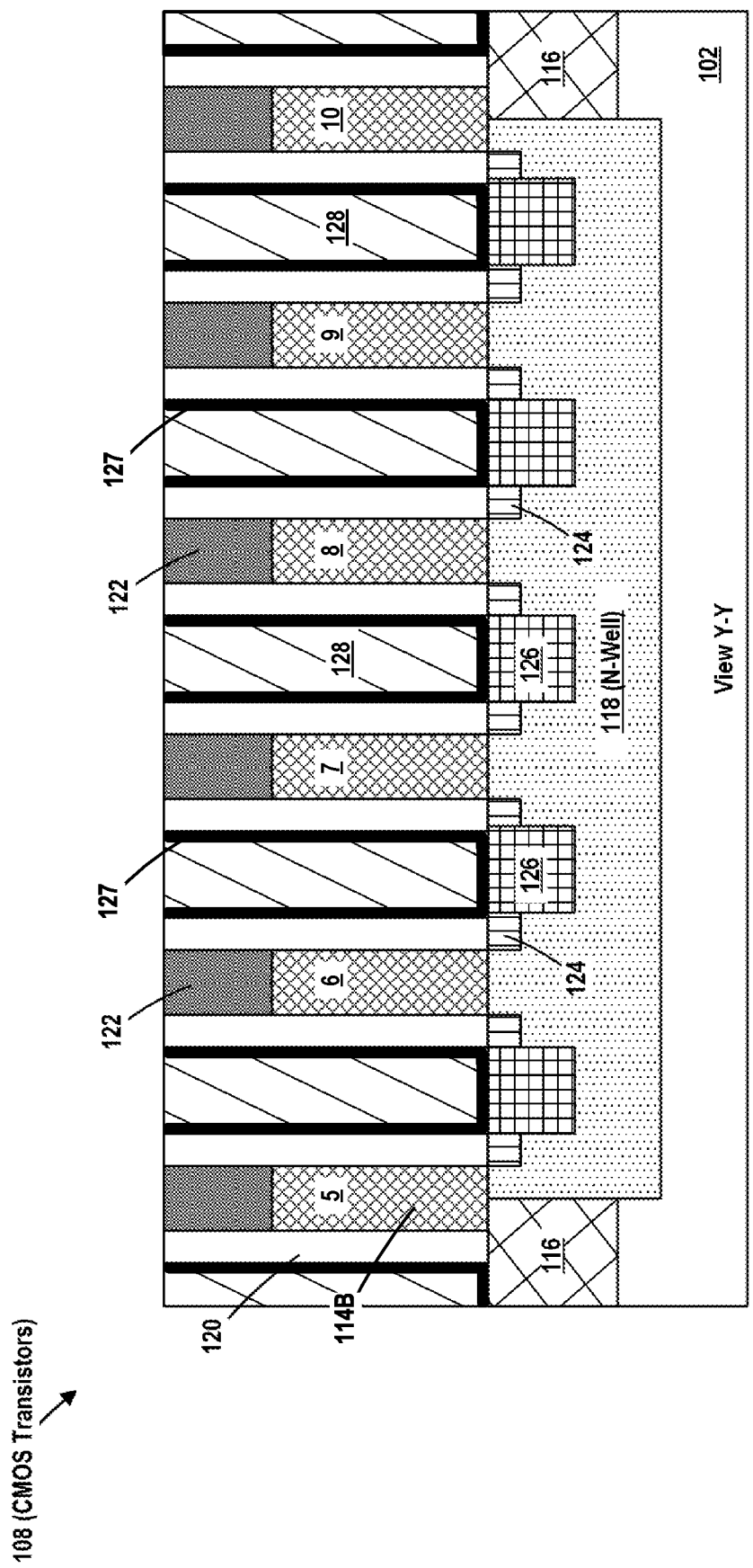

FIGS. 10 and 11 depict the IC product 100 after several process operations were performed. First, a conformal deposition process was performed to form a conformal etch-stop layer 127 above the substrate 102 in both the BJT region 106 and the CMOS circuits region 110. Thereafter, a layer of insulating material 128, e.g., flowable oxide, was formed in the spaces between adjacent sacrificial contact structures 114A and the spaces between adjacent sacrificial gate structures 114B. The layer of insulating material 128 may be initially formed so as to over-fill the spaces between the adjacent structures. At that point, a planarization or chemical mechanical polishing (CMP) process operation was performed to planarize the upper surface of the insulating material 128. This planarization process also removes the portions of the etch stop layer 127 positioned above the cap layers 122. The etch-stop layer 127 may be comprised of a variety of different materials, e.g., silicon nitride, and it may be formed to any desired thickness.

Figure 12:
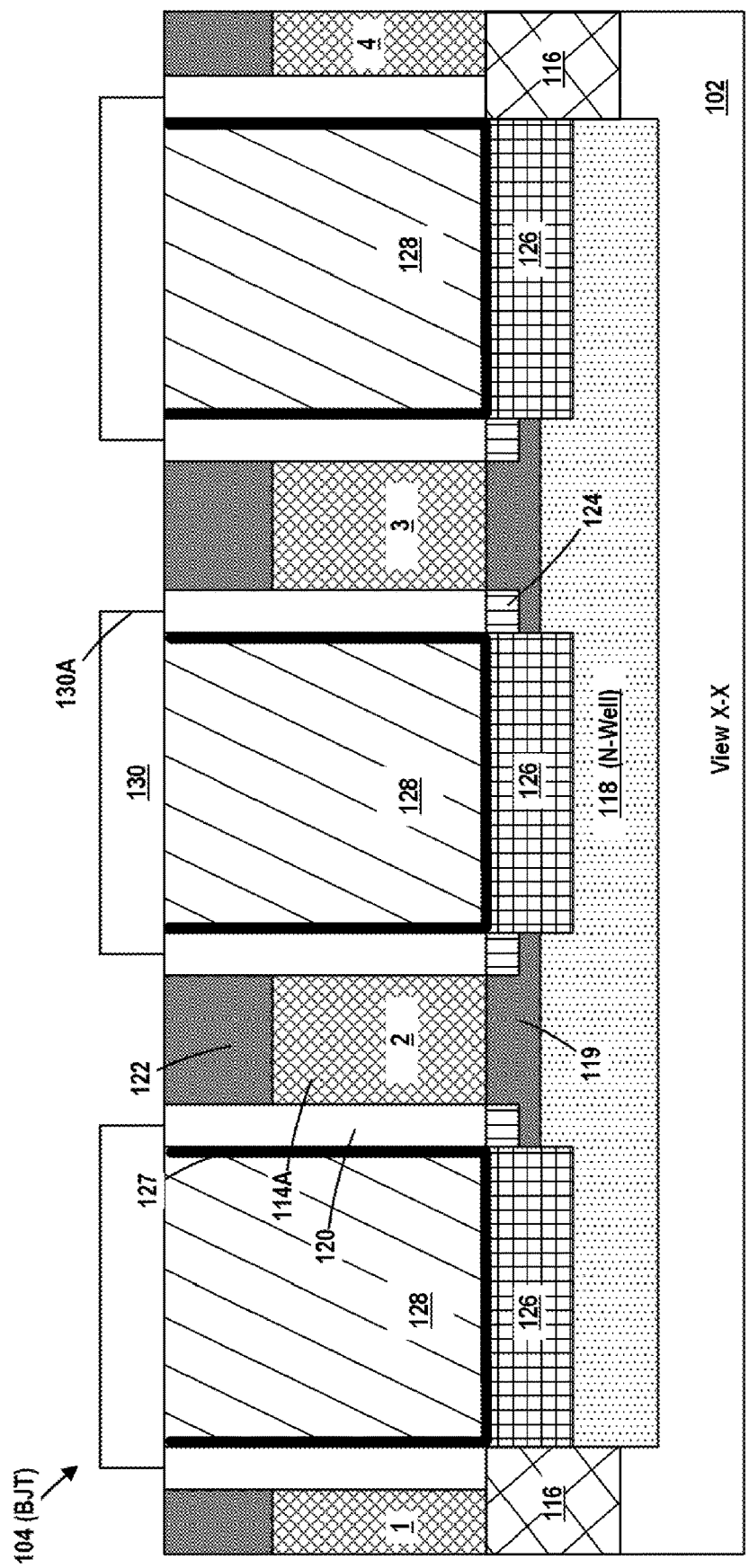
Figure 13:
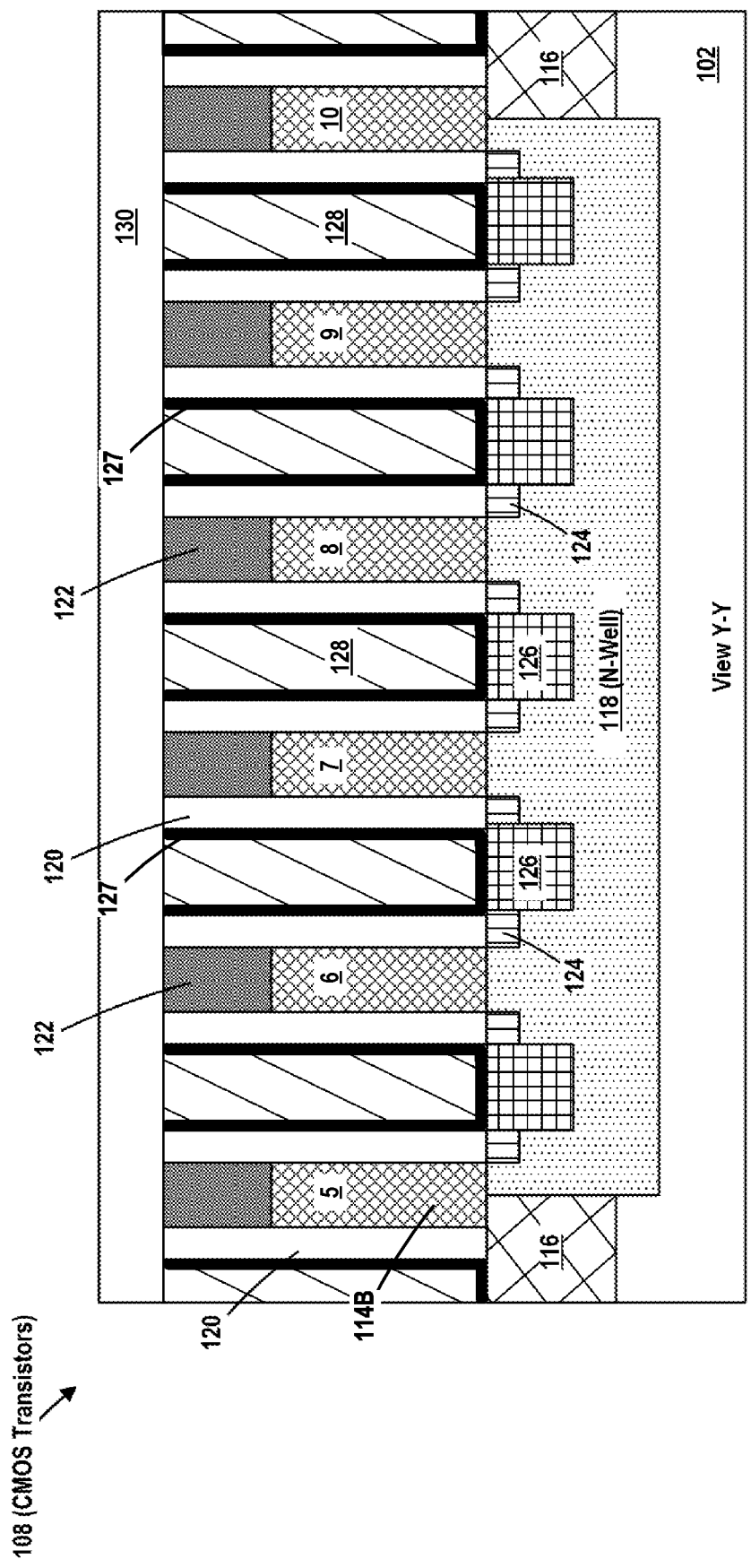

FIGS. 12 and 13 depict the IC product 100 after a patterned etch mask 130 (with a plurality of openings 130A therein) was formed above the product. In one illustrative example, the patterned etch mask 130 may be a patterned layer of photoresist or OPL. The patterned etch mask 130 covers the CMOS circuits region 110 while exposing the cap layers 122 in the BJT region 106 for further processing.

Figure 14:
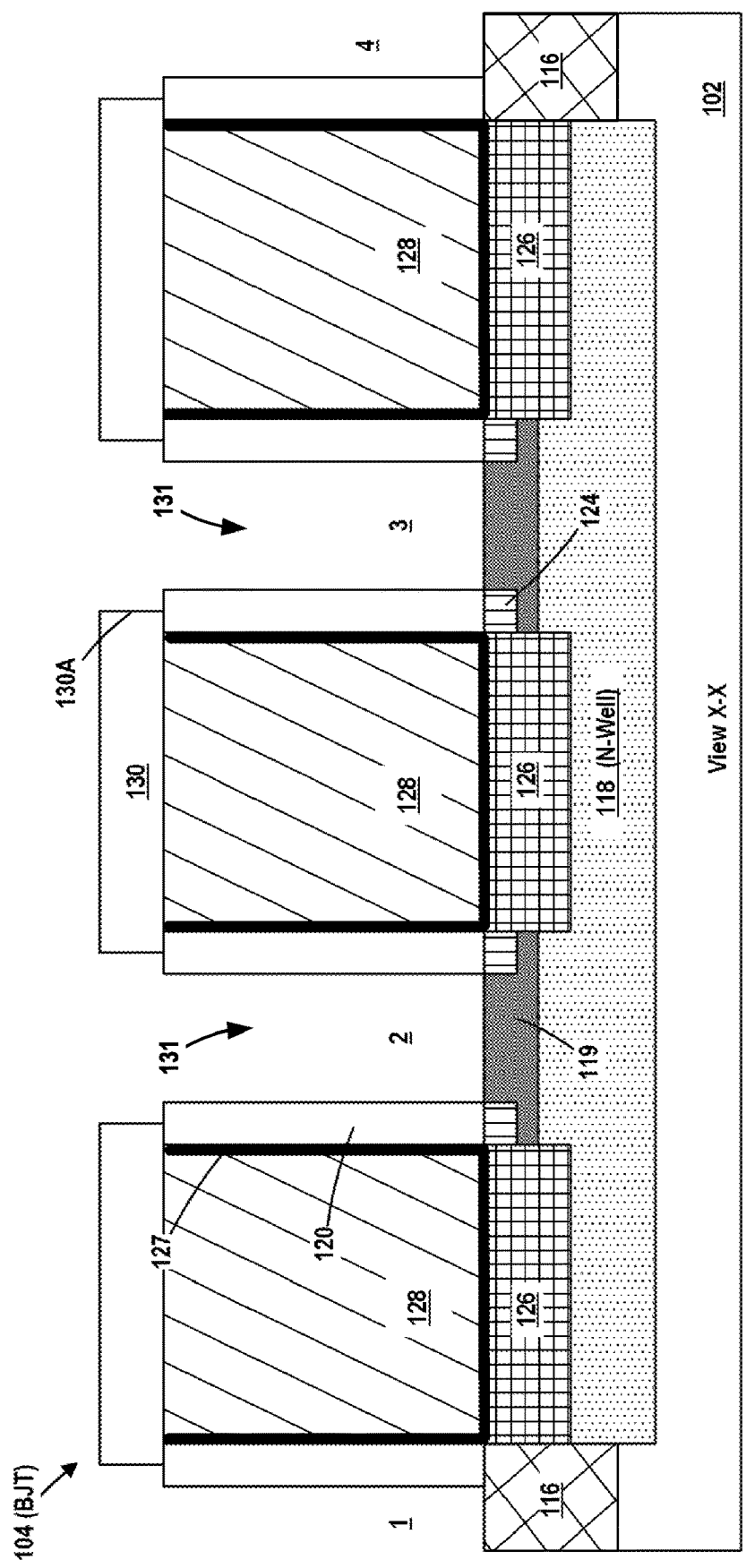
Figure 15:
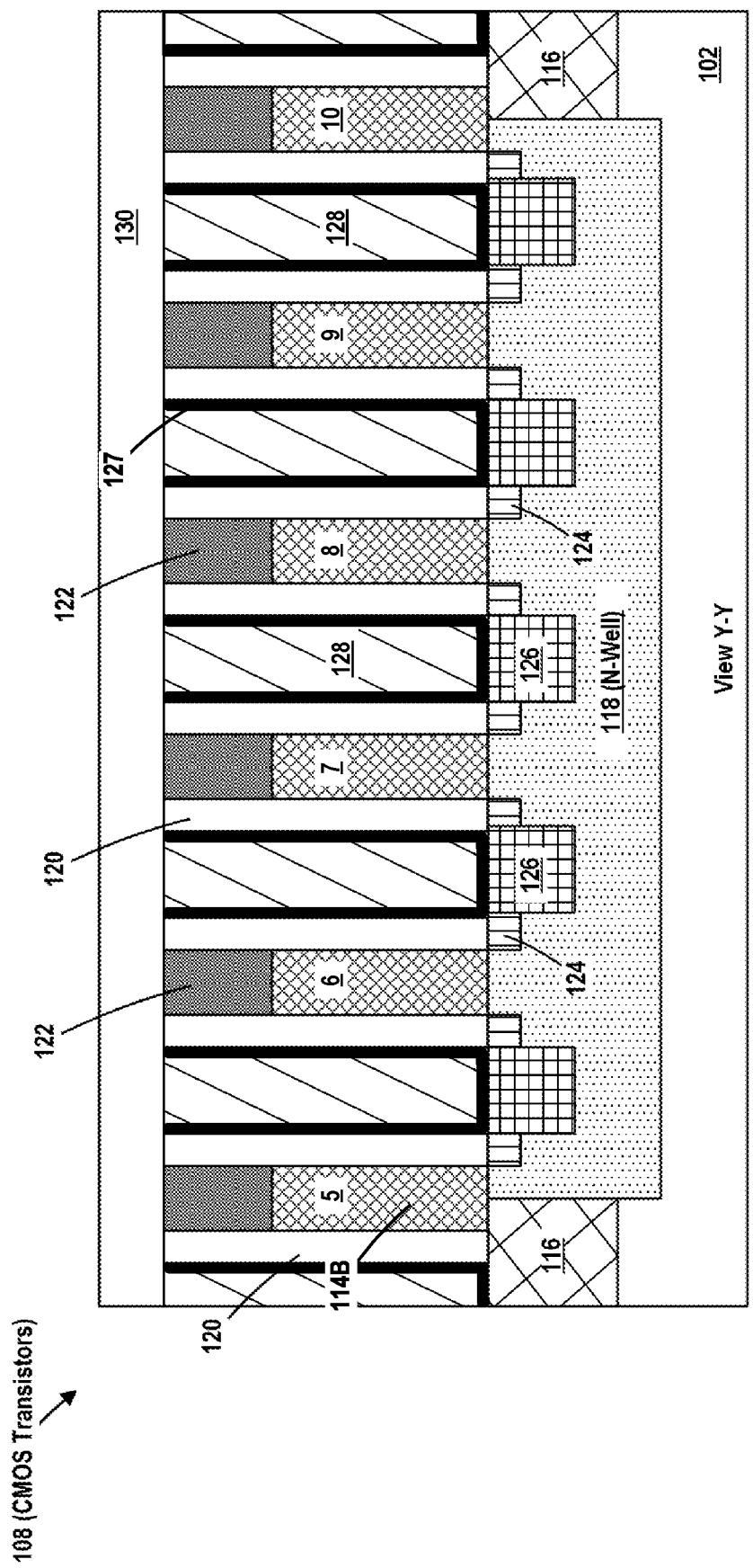

FIGS. 14 and 15 depict the IC product 100 after one or more etching processes were performed to remove the sacrificial contact structures 114A in the BJT region 106. This process operation results in the formation of contact cavities 131 for the lateral BJT device 104 at the location formerly occupied by the sacrificial contact structures 114A numbered 2 and 3. Note that the contact cavities 131 are formed in a self-aligned manner by virtue of the removal of the sacrificial contact structures 114A. As described more fully below, conductive contact structures will be formed in the contact cavities 131 formerly occupied by the sacrificial contact structures 114 numbers 2 and 3 to conductively contact the base region of the lateral BJT device 104.

Figure 16:
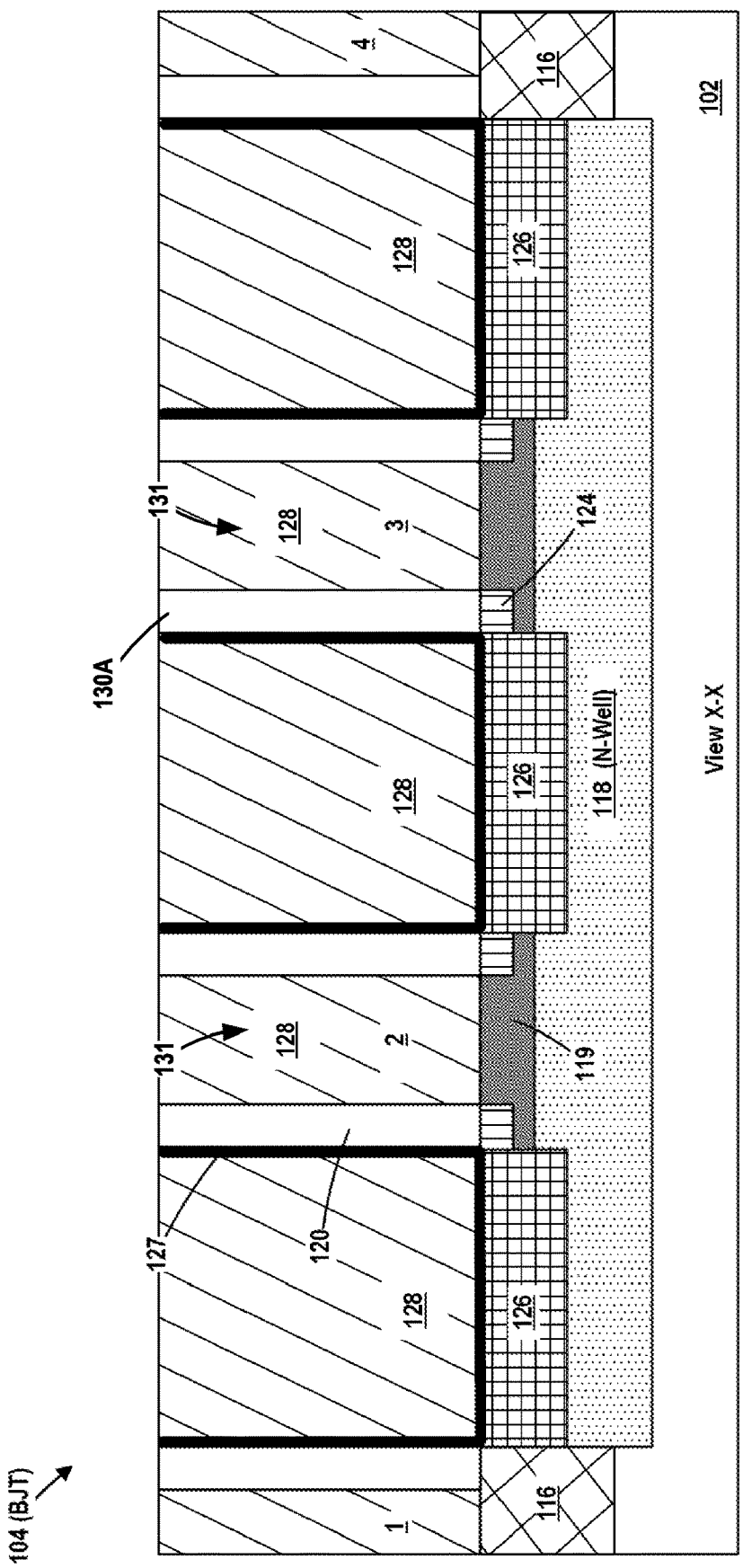
Figure 17:
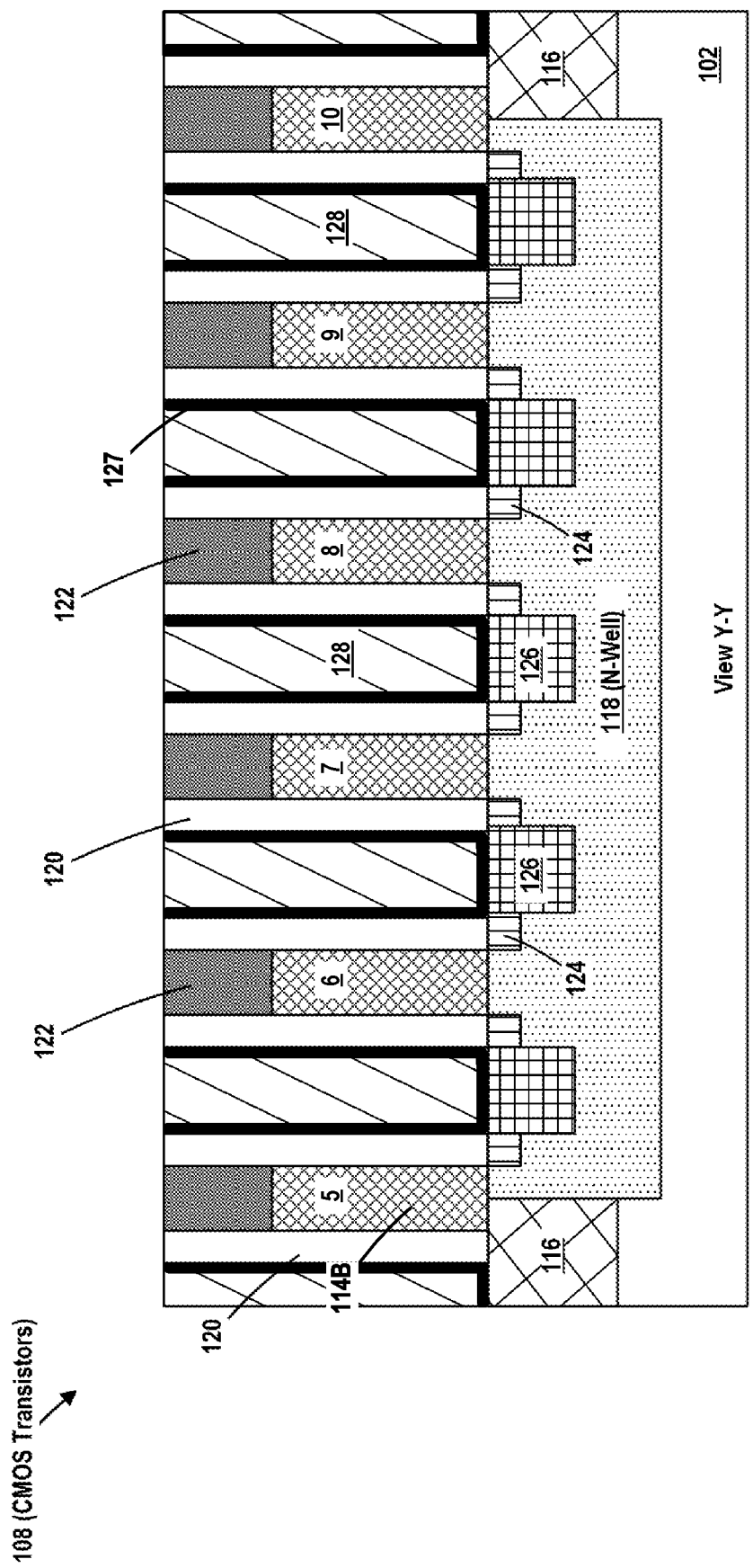

FIGS. 16 and 17 depict the IC product 100 after several process operations were performed. First, the patterned etch mask 130 was removed. Thereafter, additional insulating material 128, e.g., flowable oxide, was formed so as to over-fill the contact cavities 131. At that point, a planarization or CMP process operation was performed to planarize the upper surface of the insulating material 128 and thereby remove excess amounts of the insulating material 128 positioned outside of the contact cavities 131.

Figure 18:
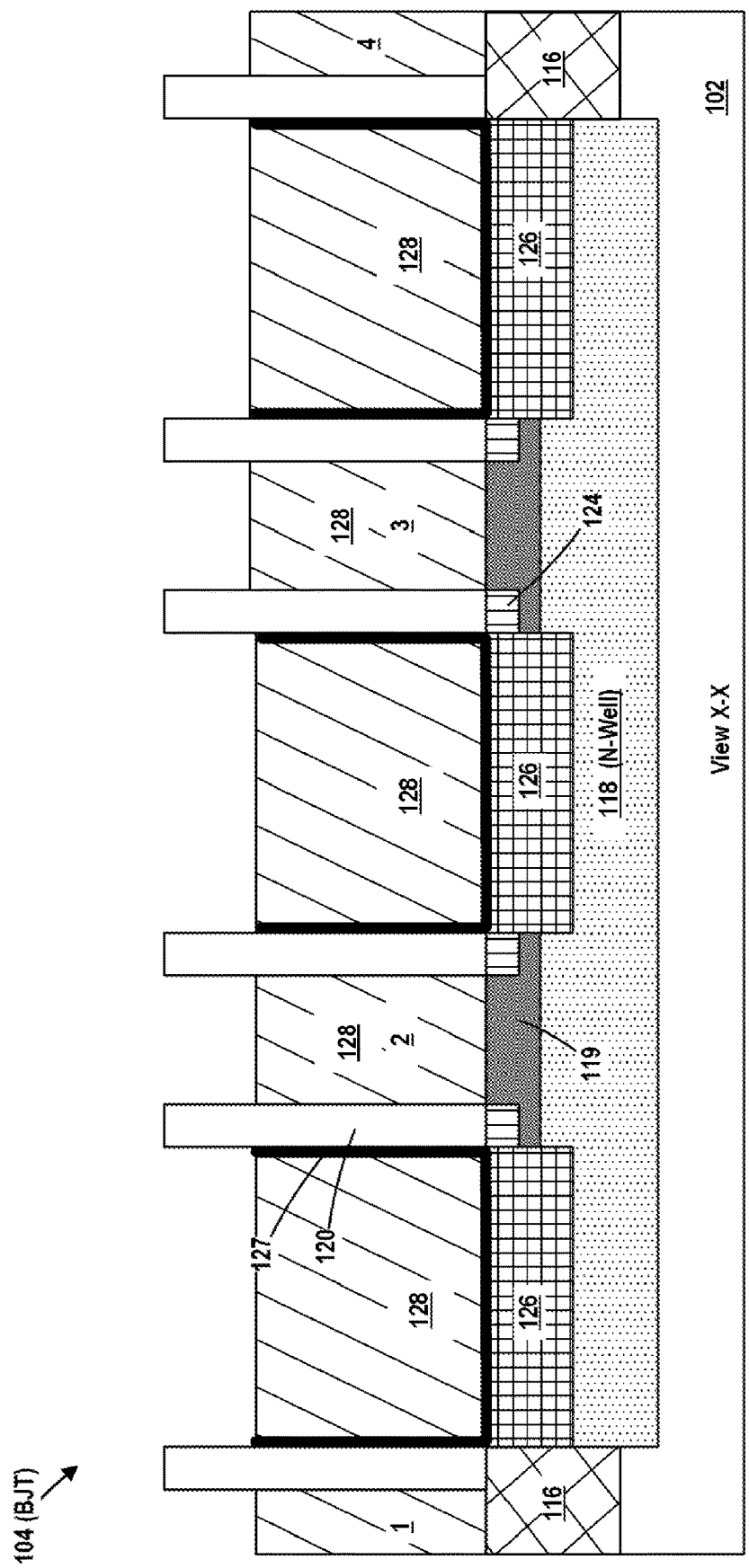
Figure 19:
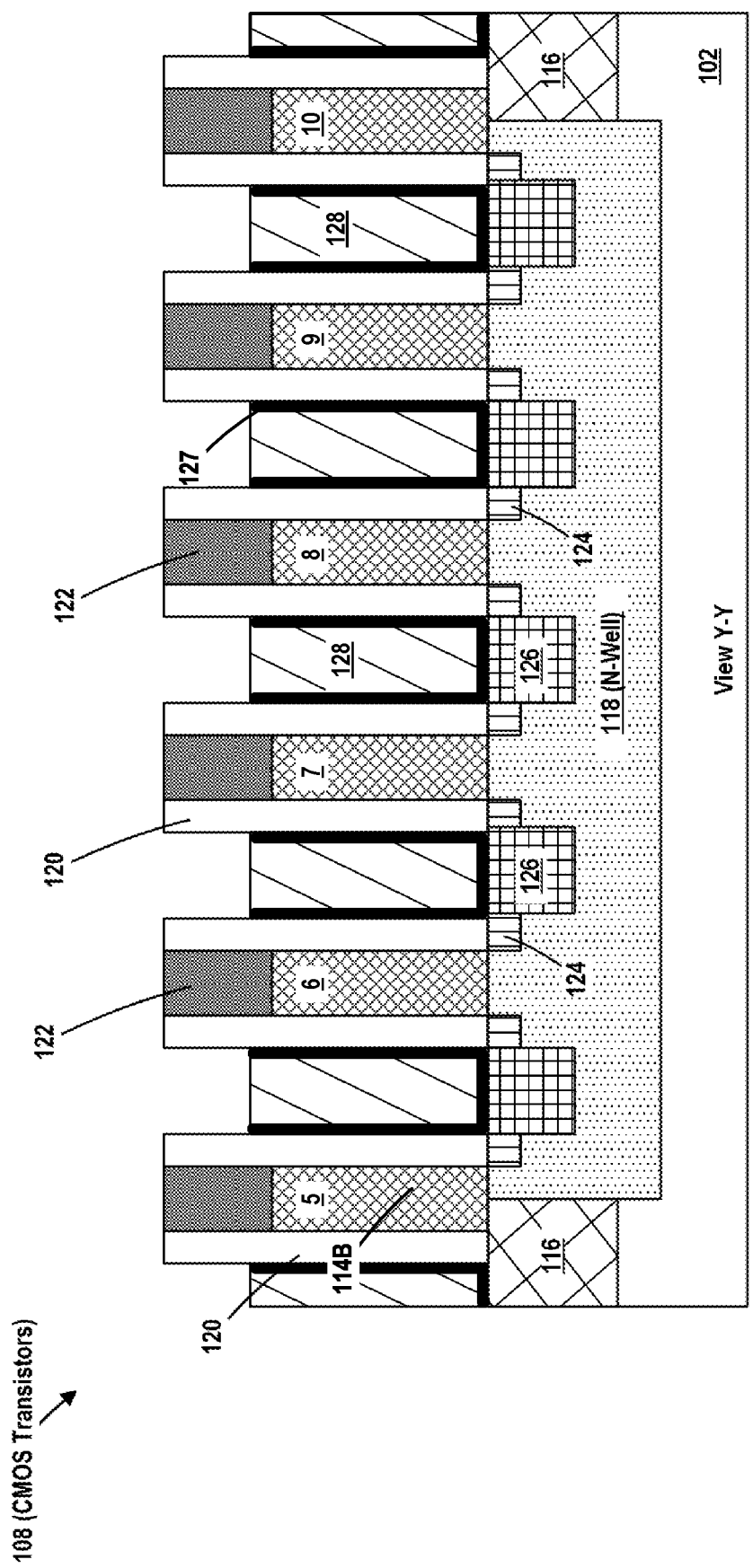

FIGS. 18 and 19 depict the IC product 100 after one or more recess etching processes were performed to recess the insulating material 128 and the etch stop layer 127 in both the BJT region 106 and the CMOS circuits region 110. The amount of recessing may vary depending upon the particular application, e.g., about 30 nm.

Figure 20:
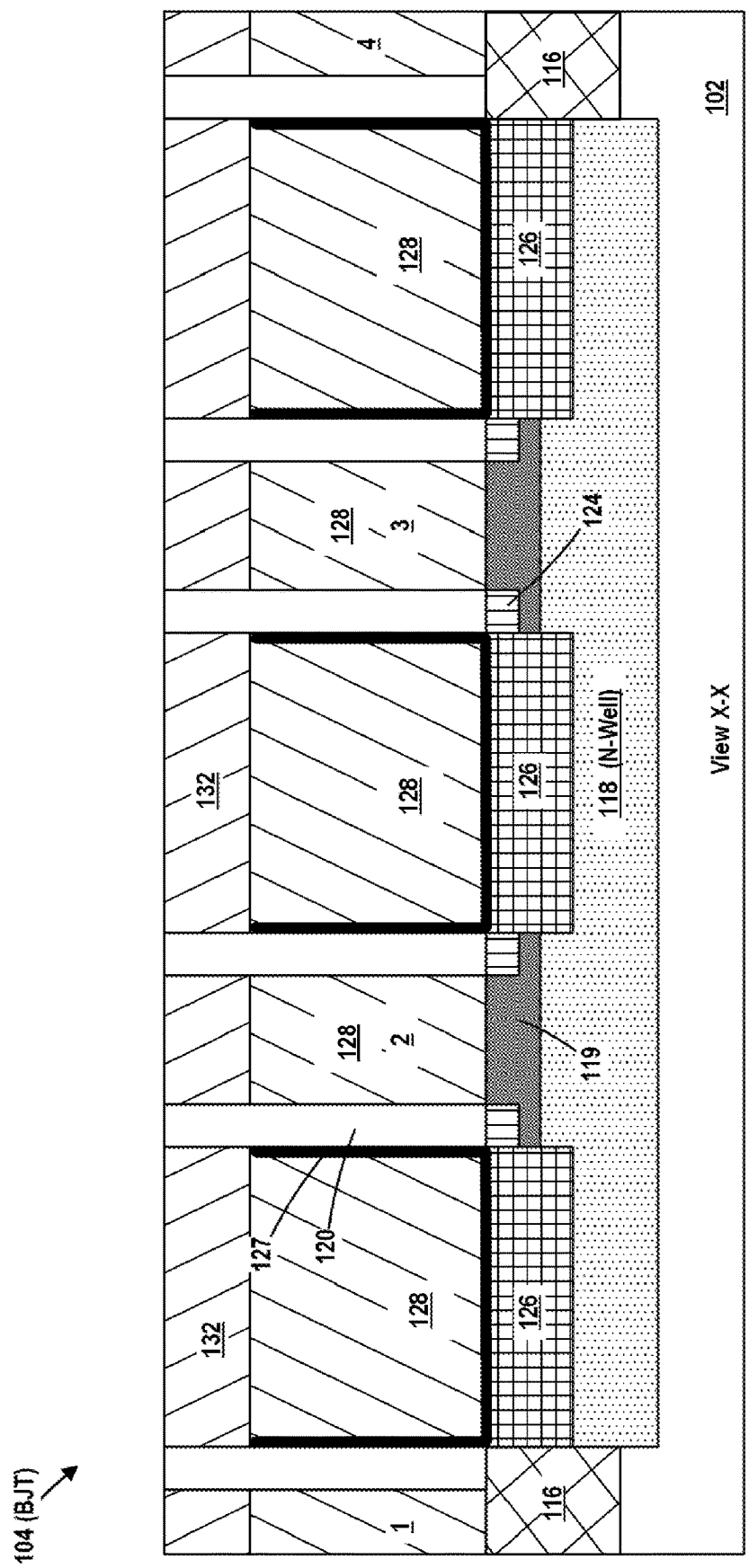
Figure 21:
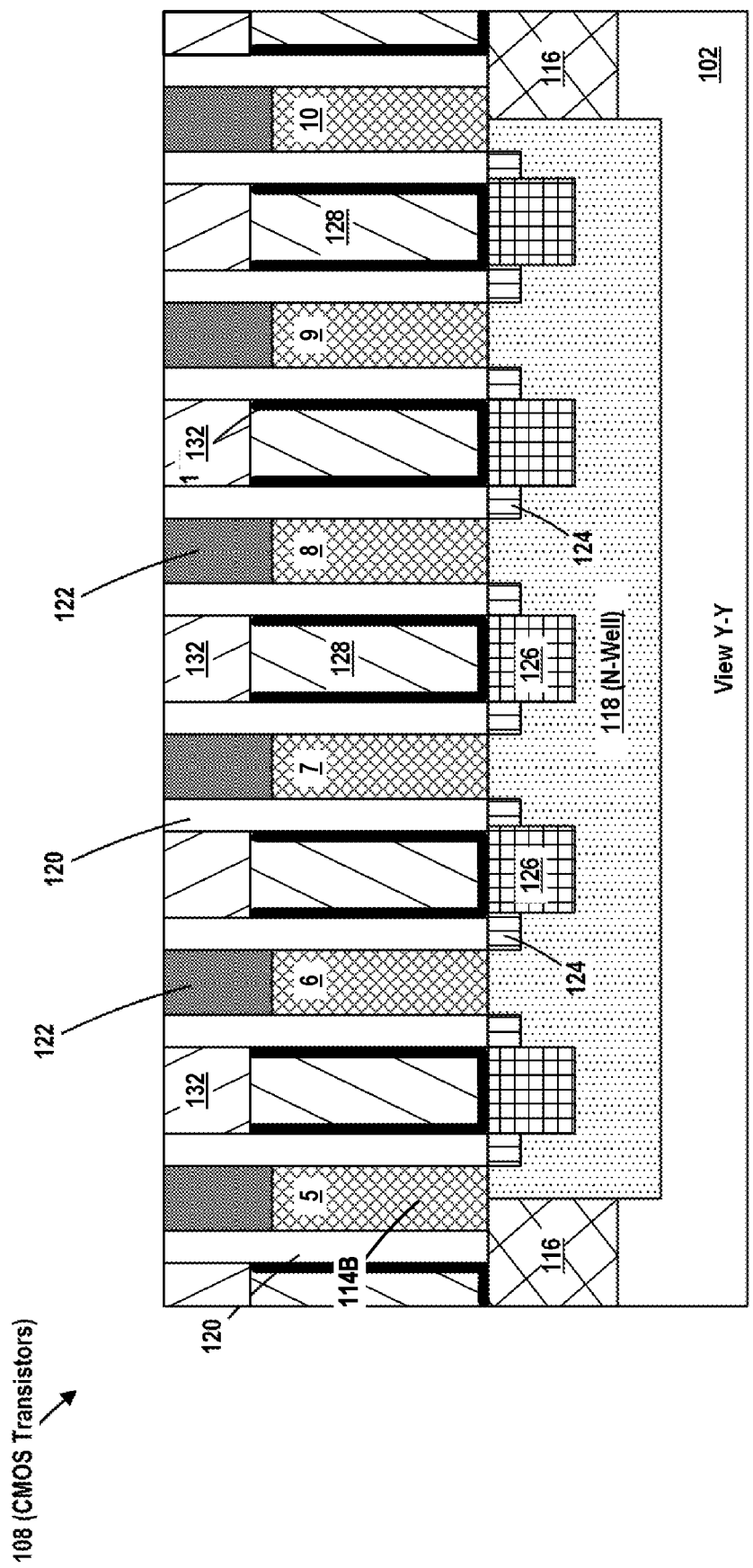

FIGS. 20 and 21 depict the IC product 100 after several process operations were performed. First, a cap layer of insulating material 132, e.g., HDP oxide, was formed above the recessed insulating material 128. Thereafter, a planarization or CMP process operation was performed to planarize the upper surface of the insulating material 132.

Figure 22:
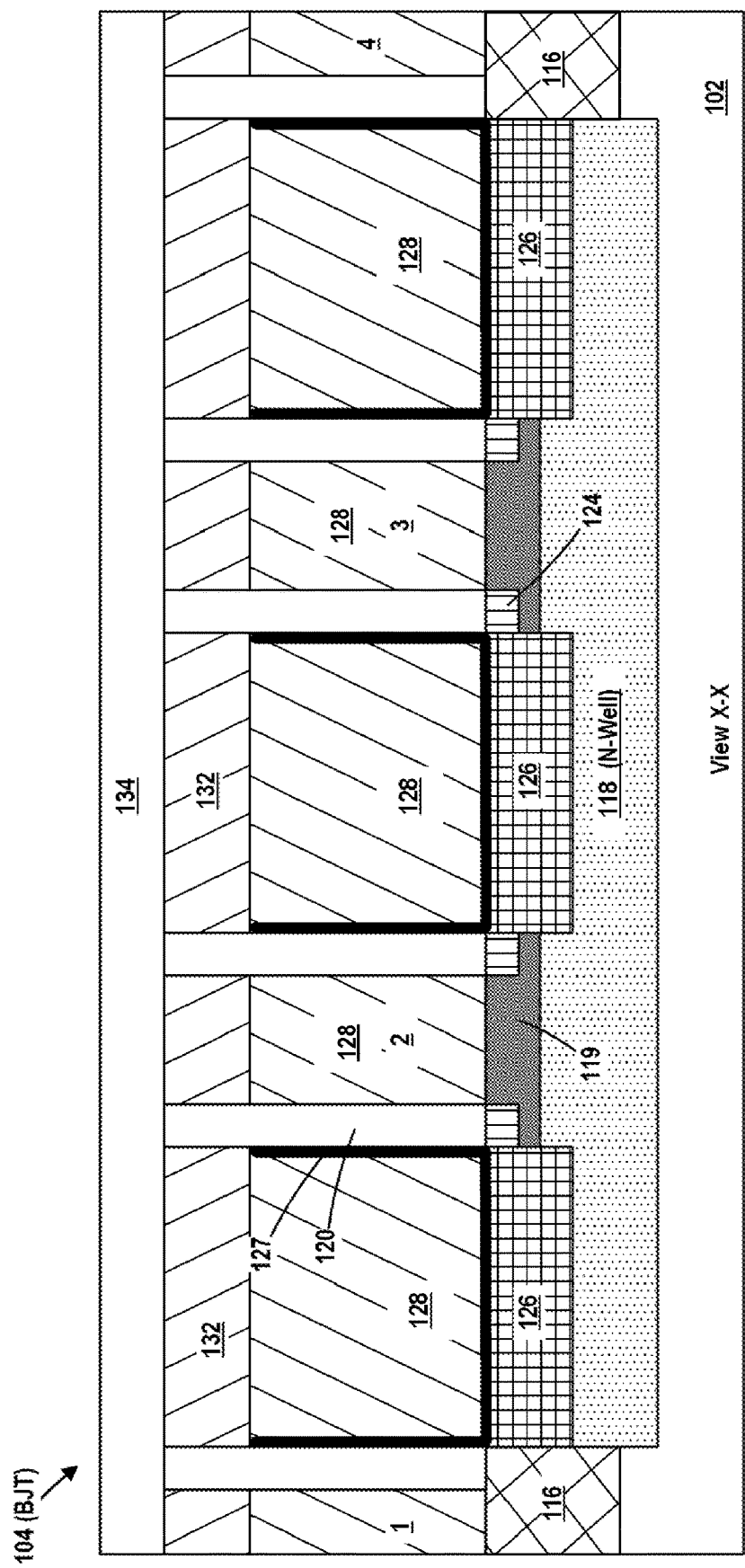
Figure 23:
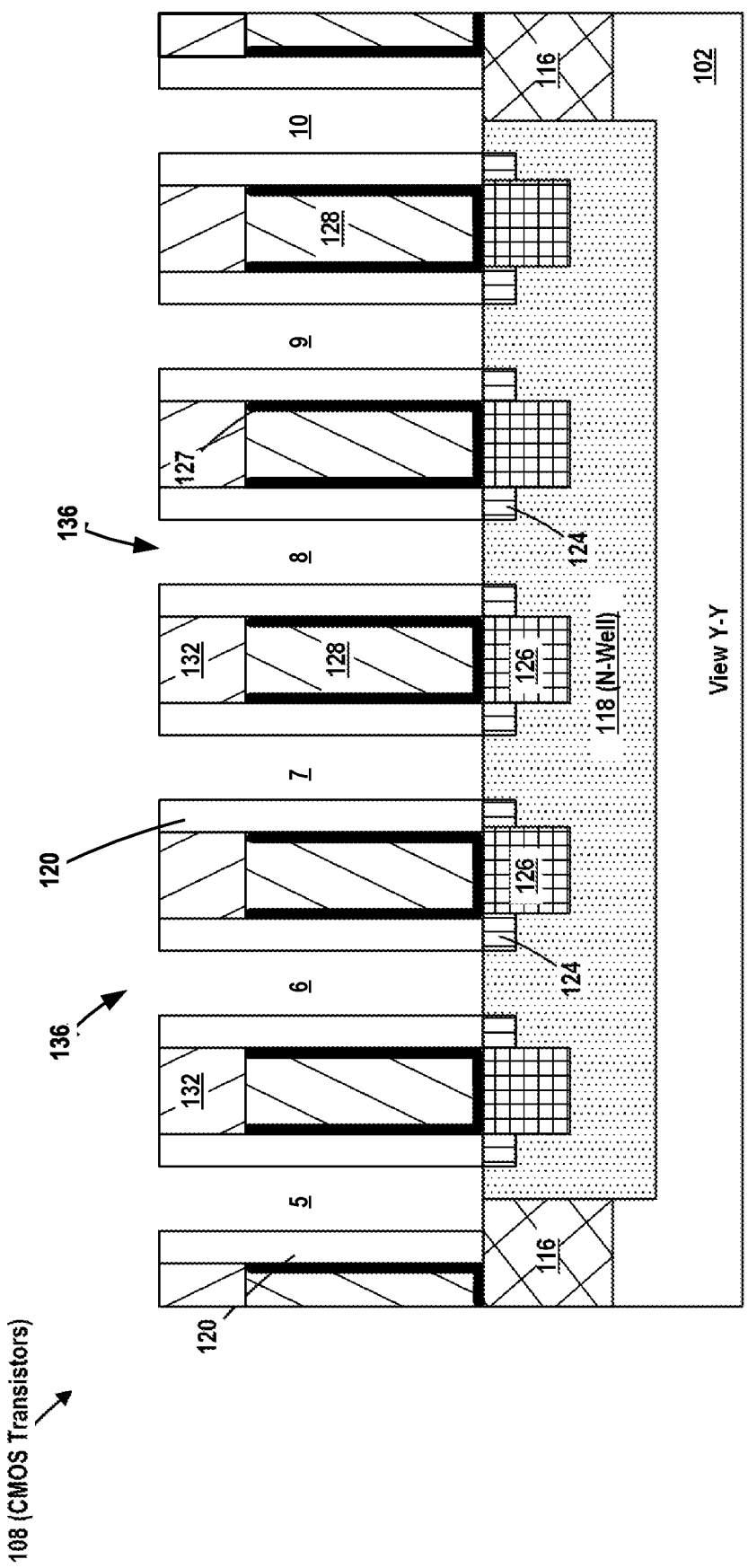

FIGS. 22 and 23 depict the IC product 100 after several process operations were performed. First, an etching process was performed to remove the cap layers 122 from above the sacrificial gate structures 114B of the transistors 108. Thereafter, another etching process was performed to remove the sacrificial gate electrode (e.g., polysilicon) of the sacrificial gate structures 114B. At that point, a patterned etch mask 134 was formed above the product. In one illustrative example, the patterned etch mask 134 may be a patterned layer of photoresist or OPL. The patterned etch mask 134 covers the BJT region 106 while exposing the CMOS circuits region 110 for further processing. Then, an etching process was performed to remove the sacrificial gate insulation layer, e.g., silicon dioxide of the sacrificial gate structures 114B. The patterned etch mask 134 protects the insulation material 132 in the BJT region 106 during the removal of the sacrificial gate insulation layer. There may be some minor loss of the insulating material 128 in the CMOS circuits region 110 during this etching process, but such loss is not depicted in the drawings. These process operations result in the formation of a plurality of replacement gate cavities 136 where a final replacement gate structure 137 (see FIG. 27) will be formed for the transistors 108.

Figure 24:
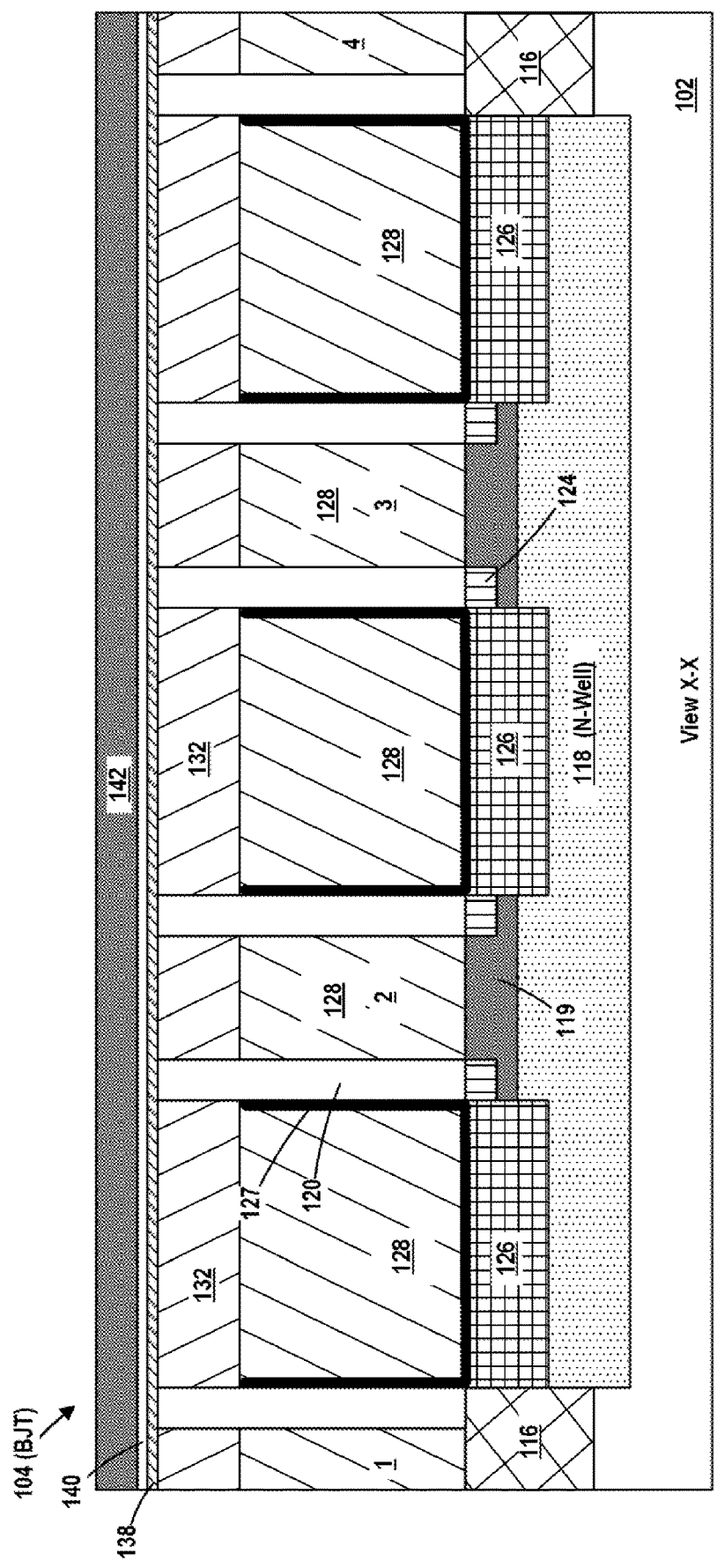
Figure 25:
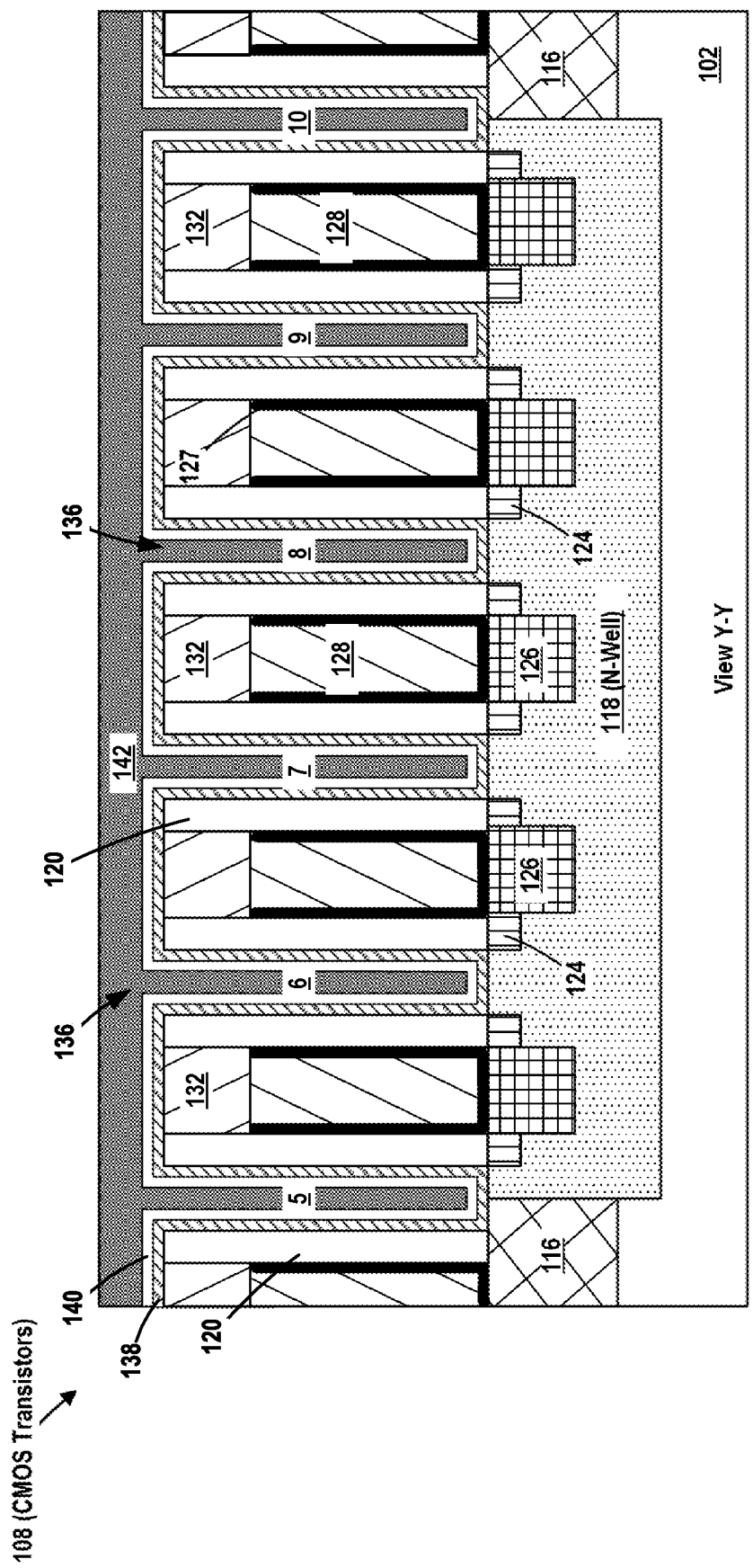

FIGS. 24 and 25 depict the IC product 100 after several process operations were performed. First, the patterned etch mask 134 was removed. Thereafter, several deposition processes were performed to form simplistically depicted materials for the replacement gate structures 137 in the gate cavities 136. In this illustrative example, the final replacement gate structures 137 include a gate insulation layer 138, a layer of work function metal 140 and another conductive material 142, such as tungsten. The final gate insulation layer 138 may be comprised of a variety of different materials, e.g., a high-k (k value of 10 or greater) material. The materials for the final gate structure 137 are also formed in the BJT region 106.

Figure 26:
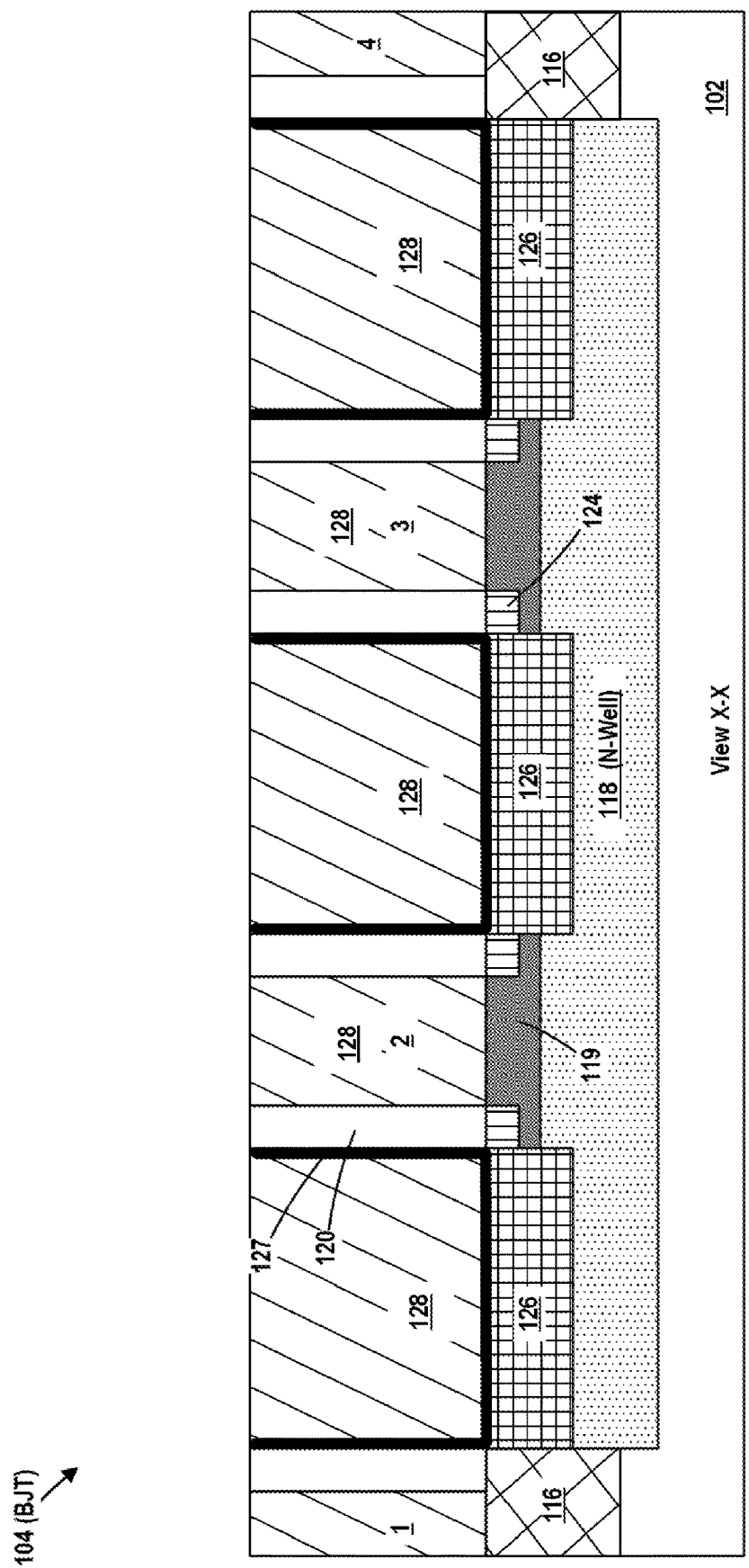
Figure 27:
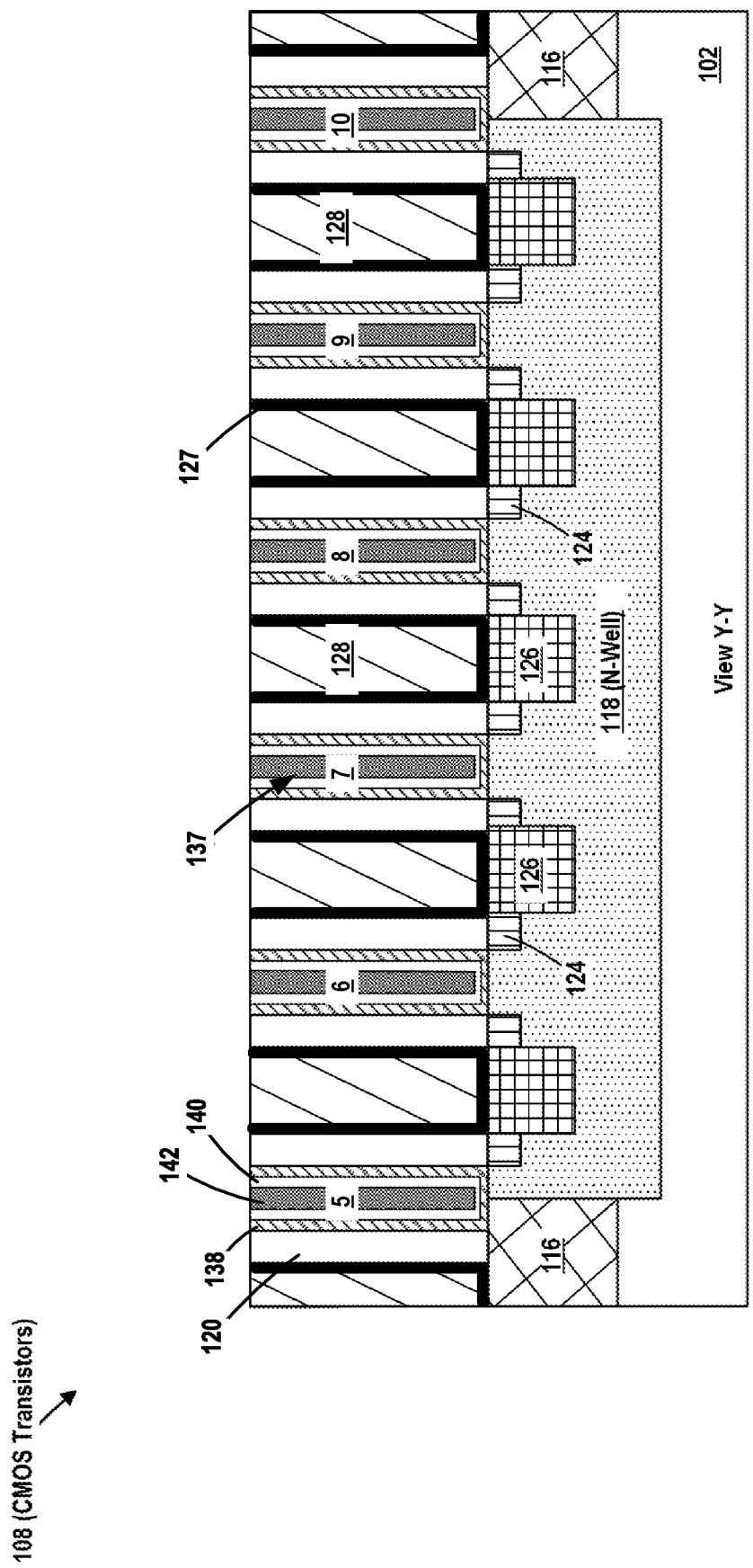

FIGS. 26 and 27 depict the IC product 100 after one or more CMP and/or etch back process operations were performed to remove all of the materials positioned above the upper surface on the insulating material 128 in both the BJT region 106 and the CMOS circuits region 110. These process operations remove excess amounts of the materials of the gate structure 137, the insulating material 132 and portions of the vertical height of the sidewall spacers 120.

Figure 28:
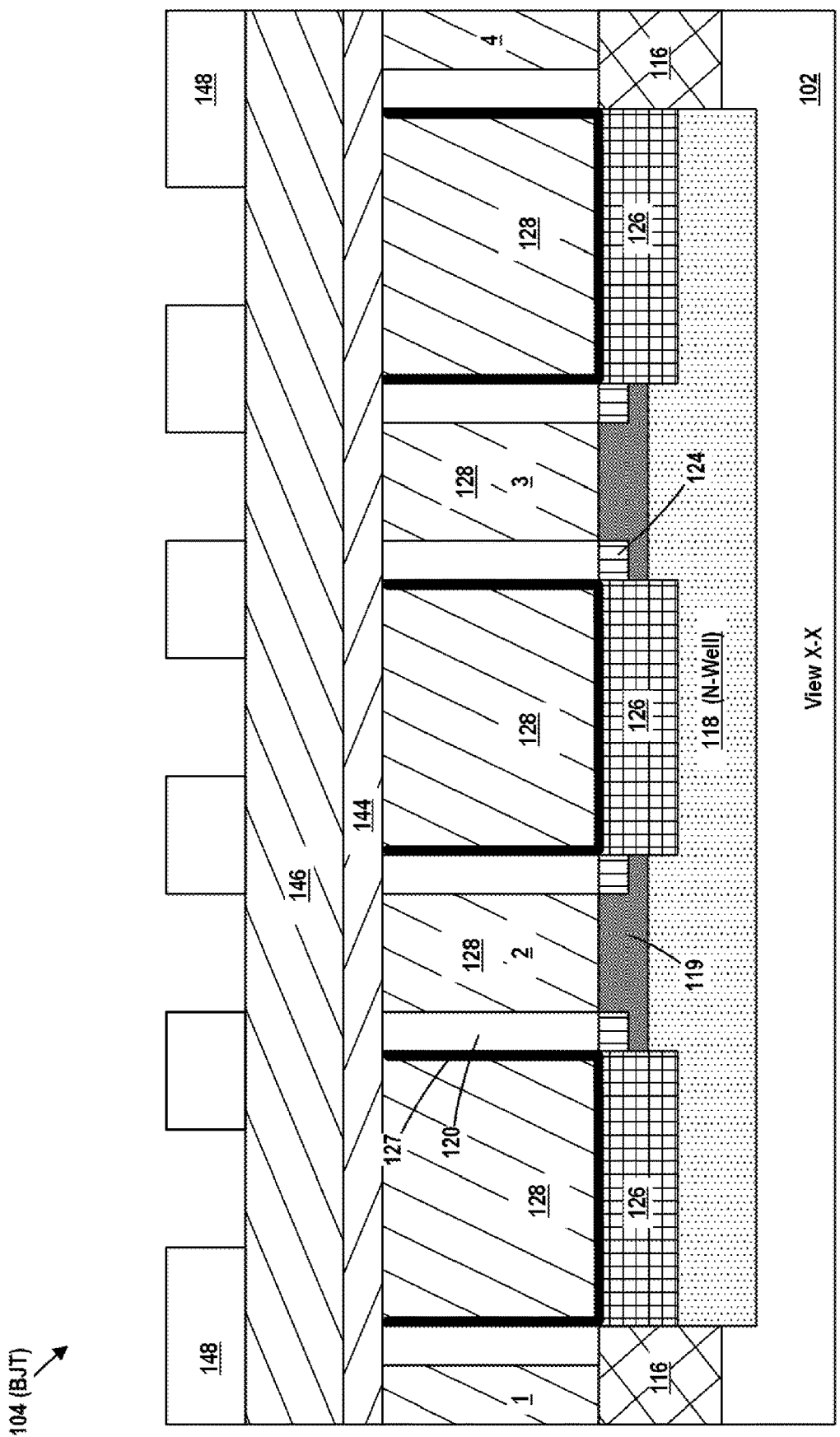
Figure 29:
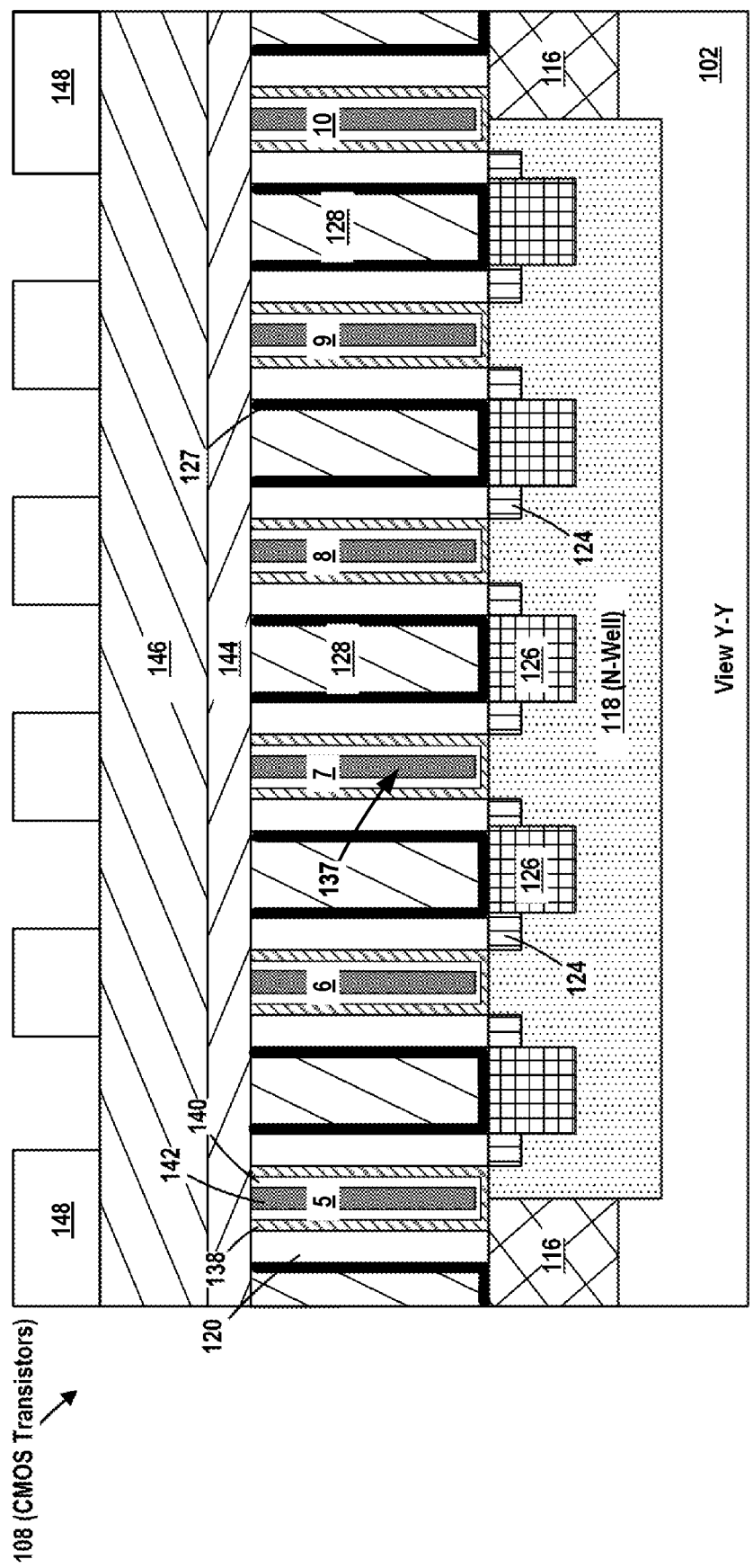

FIGS. 28 and 29 depict the IC product 100 after several process operations were performed. First, an etch stop layer 144, e.g., silicon nitride, was formed above the product in both the BJT region 106 and the CMOS circuits region 110. Next, a layer of insulating material 146, e.g., silicon dioxide was formed above the etch stop layer 144. Thereafter, a patterned etch mask 148 (with a plurality of openings therein) was formed above the product. In one illustrative example, the patterned etch mask 148 may be a patterned layer of photoresist or OPL. The patterned etch mask 144 eposes portions of the materials in both the BJT region 106 and the CMOS circuits region 110 for further processing.

Figure 30:
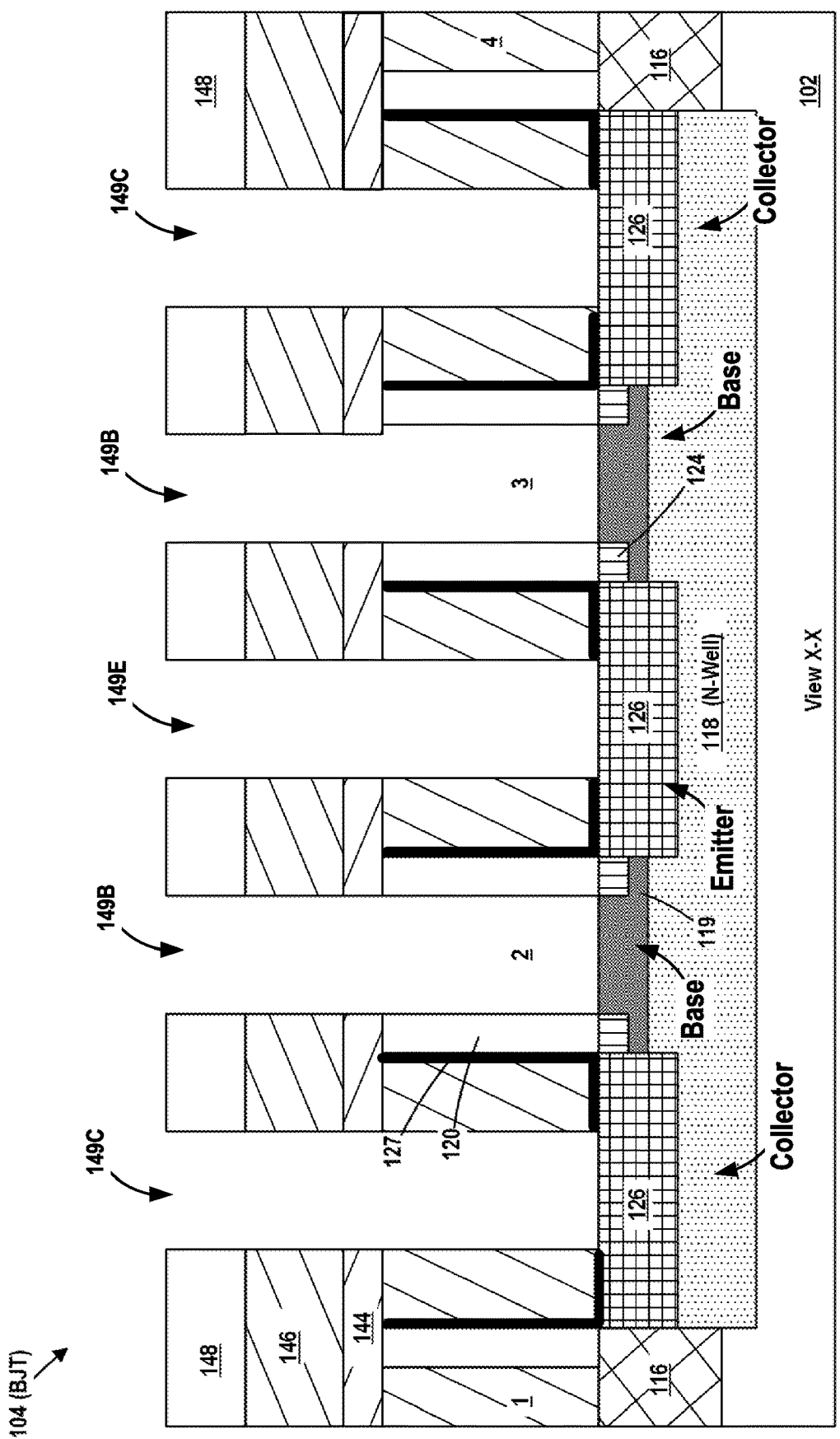
Figure 31:
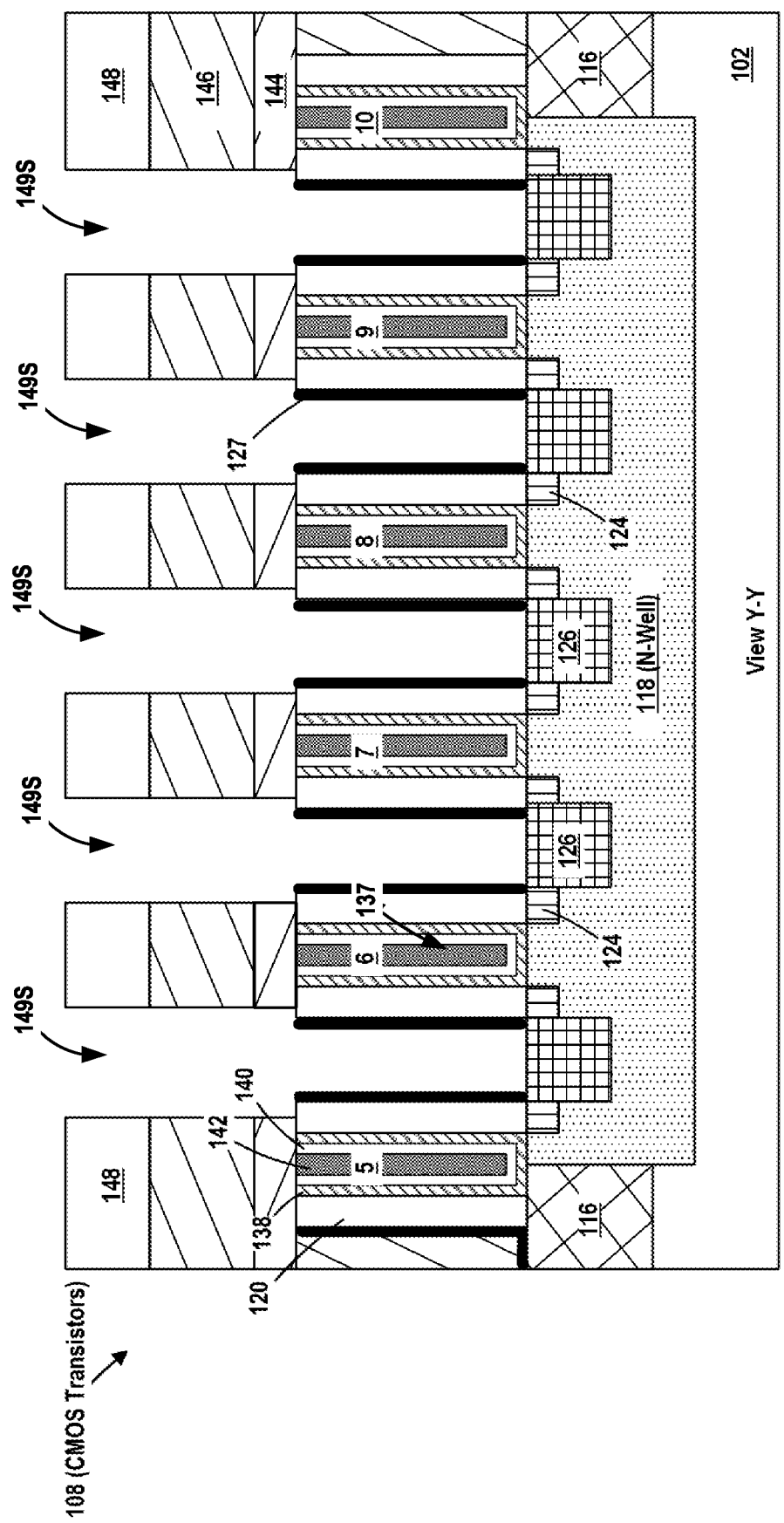

FIGS. 30 and 31 depict the IC product 100 after one or more etching processes were performed to form a plurality of contact openings 149 in both the BJT region 106 and the CMOS circuits region 110. More specifically, with reference to FIG. 30, a plurality of contact openings 149C were formed to permit contacting the P-doped collector region (the two outer regions of P-doped epi semiconductor material 126) of the lateral BJT devices 104, a plurality of contact openings 149B were formed to permit contacting of the N-doped base region (the N-doped region 119) and a single contact opening 149E was formed to permit contacting of the emitter region (the middle region of P-doped epi semiconductor material 126 shown in FIG. 30). With reference to FIG. 31, contact openings 149S were formed to permit contacting the source/drain regions of the transistor 108, i.e., to permit contacting the regions of P-doped epi semiconductor material 126.

Figure 32:
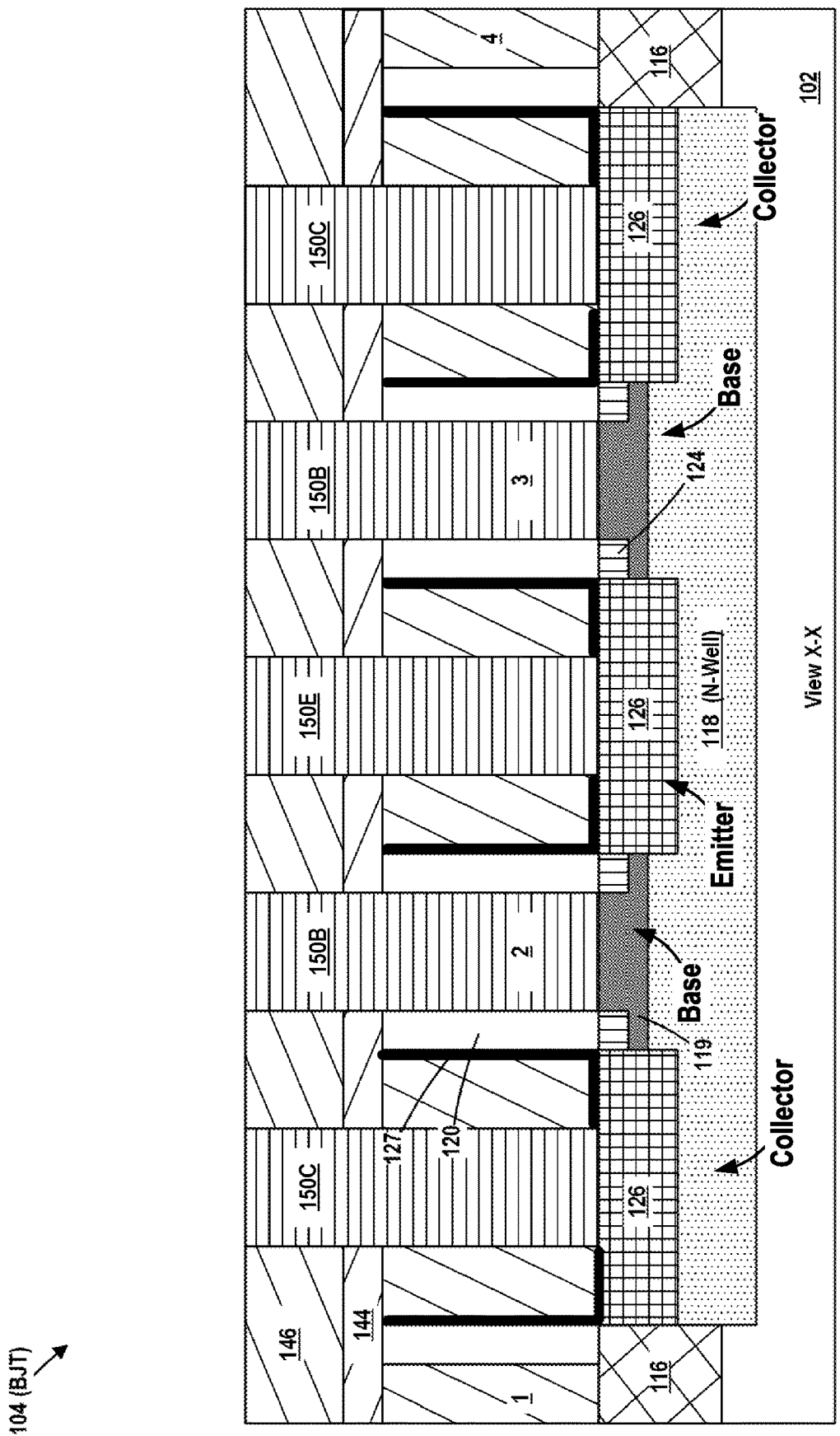
Figure 33:
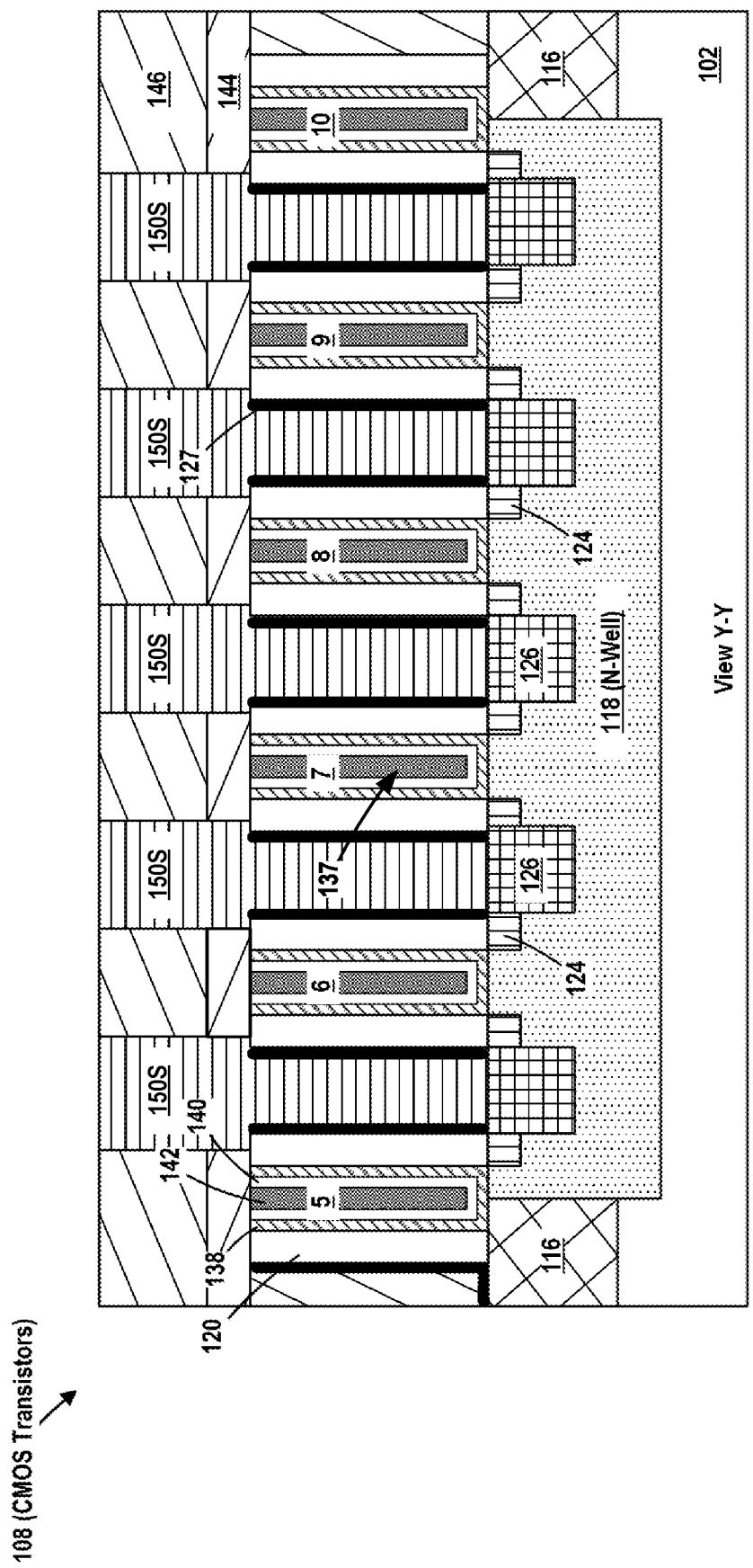

FIGS. 32 and 33 depict the IC product 100 after several process operations were performed. First, the patterned etch mask 148 was removed. Thereafter, various process operations were performed to form conductive contact structures 150E, 150B and 150C to conductively contact the emitter region, the base region and the collector region, respectively, of the lateral BJT device 104 and to form a plurality of conductive source/drain metallization structures 150S that conductively contact the source/drain regions of the transistors 108. Importantly, the conductive contact structures 150E, 150B and 150C and the conductive source/drain metallization structures 150S are all formed at the same time and they have the same materials of construction. However, the conductive contact structures 150E, 150B and 150C and the conductive source/drain metallization structures 150S need not be of the same physical size or have the same configuration when viewed from above. For example, the conductive source/drain metallization structures 150S may be line-type structures that extend into and out of the plane of the drawing page in FIG. 33 that extend for substantially the entire length of the active region (in a direction that corresponds to the gate width direction of the transistors). In some cases, the conductive contact structures 150E, 150B and 150C may be more or less point-type contact structures. Of course, any desired number of conductive contact structures may be formed to contact the base region, the emitter region and the collector region.

The conductive contact structures 150E, 150B and 150C and the conductive source/drain metallization structures 150S may be comprised of any type of conductive material (s). In one illustrative example, the conductive contact structures 150E, 150B and 150C and the conductive source/drain metallization structures 150S may comprise a trench metal silicide material (not separately shown) that is formed on and in contact with regions of P-doped epi semiconductor material 126 and/or the base region of the BJT device 104, and a metal material, such as tungsten (not separately shown), that is formed on and in contact with the trench metal silicide material. The material or materials used for the conductive contact structures 150E, 150B and 150C and the conductive source/drain metallization structures 150S may be formed so as to initially over-fill the contact openings and a chemical mechanical polishing (CMP) process may be performed to remove excess materials located above the upper surface of the layer of insulating material 148. Note that the conductive contact structures 150B directly, i.e., physically, contacts the base region of the lateral BJT device 104, thereby providing a reduction in the base contact resistance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
a semiconductor substrate;
a bipolar junction transistor (BJT) device, the BJT device comprising a collector region, a base region and an emitter region;
a field effect transistor, the field effect transistor comprising source/drain regions;
at least one conductive contact structure that conductively contacts one of the collector region, the base region and the emitter region;
a conductive source/drain metallization structure that conductively contacts one of the source/drain regions, wherein a material of construction of the at least one conductive contact structure and a material of construction of the conductive source/drain metallization structure are the same;
a first fin structure, wherein at least a portion of the collector region, the base region and the emitter region is positioned in the first fin structure; and
a second fin structure separate from and parallel to the first fin structure, wherein at least a portion of the source/drain regions is positioned in the second fin structure.

2. The device of claim 1, wherein the BJT device is one of an NPN BJT device or a PNP BJT device and wherein the field effect transistor is one of an NFET device or a PFET device.

3. The device of claim 1, wherein the at least one conductive contact structure comprises at least one collector conductive contact structure, at least one base conductive contact structure and at least one emitter conductive contact structure, wherein the at least one base conductive contact structure physically contacts the base region.

4. The device of claim 1, wherein the field effect transistor is one of a FinFET device or a planar device.

5. The device of claim 1, wherein the material of construction of the at least one conductive contact structure and the material of construction of the conductive source/drain metallization structure comprises a metal silicide material and a conductive material positioned above the metal silicide material.

6. The device of claim 1, wherein the base region comprises a doped region positioned in the first fin structure laterally between the collector region and the emitter region.

7. A device, comprising:
first and second fin structures defined in a semiconductor substrate, the second fin structure being separate and parallel to the first fin structure;
a bipolar junction transistor (BJT) device, the BJT device comprising a collector region, a base region and an emitter region, wherein at least a portion of the collector region, the base region and the emitter region is positioned in the first fin structure;
a field effect transistor, the field effect transistor comprising source/drain regions, wherein at least a portion of the source/drain regions is positioned in the second fin structure;
at least one collector conductive contact structure that conductively contacts the collector region;
at least one base conductive contact structure that conductively and physically contacts the base region;
at least one emitter conductive contact structure that conductively contacts the emitter region; and
a conductive source/drain metallization structure that conductively contacts one of the source/drain regions, wherein the at least one collector conductive contact structure, the at least one base conductive contact structure, the at least one emitter conductive contact structure and the conductive source/drain metallization structure all comprise a same material of construction.

8. The device of claim 7, wherein the same material of construction comprises a metal silicide material and a conductive material positioned above the metal silicide material.

9. The device of claim 8, wherein the collector region comprises at least one first doped epitaxial semiconductor material region, the emitter region comprises at least one second doped epitaxial semiconductor material and the source/drain regions comprise a third doped epitaxial semiconductor material, wherein the first, second and third doped epitaxial semiconductor materials comprise a same doped epitaxial semiconductor material.

10. The device of claim 9, wherein the base region comprises a doped region positioned in the first fin structure between the collector region and the emitter region.

11. A device, comprising:
a semiconductor substrate;
a bipolar junction transistor (BJT) device, the BJT device comprising a collector region, a base region and an emitter region;

a field effect transistor;
at least one base conductive contact structure that conductively and physically contacts the base region;
a first fin structure, wherein at least a portion of the collector region, the base region and the emitter region is positioned in the first fin structure; and
a second fin structure separate from and parallel to the first fin structure, wherein at least a portion of the field effect transistor is positioned in the second fin structure.

12. The device of claim 11, further comprising source/drain regions for the field effect transistor, the source/drain regions comprising a first doped epitaxial semiconductor material, wherein the collector region comprises a second doped epitaxial semiconductor material region, the emitter region comprises a third doped epitaxial semiconductor material region and wherein the first, second and third doped epitaxial semiconductor materials comprise a same doped epitaxial semiconductor material.

13. The device of claim 12, further comprising a second fin structure, wherein at least a portion of the source/drain regions is positioned in the second fin structure.

14. The device of claim 11, further comprising:
at least one collector conductive contact structure that conductively contacts the collector region;
at least one emitter conductive contact structure that conductively contacts the emitter region;
source/drain regions for the field effect transistor; and
a conductive source/drain metallization structure that conductively contacts one of the source/drain regions, wherein the at least one collector conductive contact structure, the at least one base conductive contact structure, the at least one emitter conductive contact structure and the conductive source/drain metallization structure all comprise a same material of construction.

15. The device of claim 11, wherein the material of construction of the at least one base conductive contact structure comprises a metal silicide material and a conductive material positioned above the metal silicide material.

16. The device of claim 11, wherein the base region comprises a doped region positioned in the substrate laterally between the collector region and the emitter region.

* * * * *